(12) United States Patent
Dong et al.

(10) Patent No.: US 8,045,384 B2
(45) Date of Patent: Oct. 25, 2011

(54) REDUCED PROGRAMMING PULSE WIDTH FOR ENHANCED CHANNEL BOOSTING IN NON-VOLATILE STORAGE

(75) Inventors: Yingda Dong, San Jose, CA (US); Jeffrey W. Lutze, San Jose, CA (US)

(73) Assignee: SanDisk Technologies Inc., Plano, TX (US)

( * ) Notice: Subject to any disclaimer, the term of this patent is extended or adjusted under 35 U.S.C. 154(b) by 249 days.

(21) Appl. No.: 12/488,967

(22) Filed: Jun. 22, 2009

(65) Prior Publication Data

US 2010/0322005 A1     Dec. 23, 2010

(51) Int. Cl.
G11C 16/04     (2006.01)
(52) U.S. Cl. ............... 365/185.17; 365/185.19; 365/211
(58) Field of Classification Search ............. 365/185.14, 365/185.17, 185.19, 185.09, 185.28, 185.33, 365/210.11, 211
See application file for complete search history.

(56) References Cited

U.S. PATENT DOCUMENTS

| 5,608,679 | A  | 3/1997  | Mi     |
| 6,661,724 | B1 | 12/2003 | Snyder |
| 6,987,703 | B2 | 1/2006  | Tanaka |
| 2005/0254306 | A1 | 11/2005 | Wang |
| 2006/0291290 | A1 | 12/2006 | Kim  |
| 2008/0298124 | A1 | 12/2008 | Wong |
| 2008/0316833 | A1 | 12/2008 | Fong |
| 2009/0010065 | A1 | 1/2009  | Lutze |
| 2009/0067266 | A1 | 3/2009  | Roohparvar |

FOREIGN PATENT DOCUMENTS

| JP | 2004303327 A | * | 10/2004 |
| WO | WO2006/124525 A1 | | 11/2006 |

OTHER PUBLICATIONS

International Search Report & The Written Opinion of the International Searching Authority dated May 10, 2011, International Application No. PCT/US2010/037839 filed Jun. 8, 1020.

* cited by examiner

*Primary Examiner* — J. H. Hur
*Assistant Examiner* — Hai Pham
(74) *Attorney, Agent, or Firm* — Vierra Magen Marcus & DeNiro LLP

(57) ABSTRACT

Program disturb is reduced in a non-volatile storage system during a programming operation by switching from using programming pulses of a longer duration to programming pulses of a shorter duration, partway through the programming operation. A switchover point can be based on temperature, selected word line position and/or tracking of storage elements to a trigger state. The switchover point occurs sooner for higher temperatures, and for drain side word lines. The trigger state can be selected based on temperature. A portion of storage elements which are required to reach the trigger state to trigger a switchover can also be set a function of temperature. Programming pulses of a shorter duration improve channel boosting for inhibited storage elements, thereby reducing program disturb for these storage elements.

19 Claims, 13 Drawing Sheets

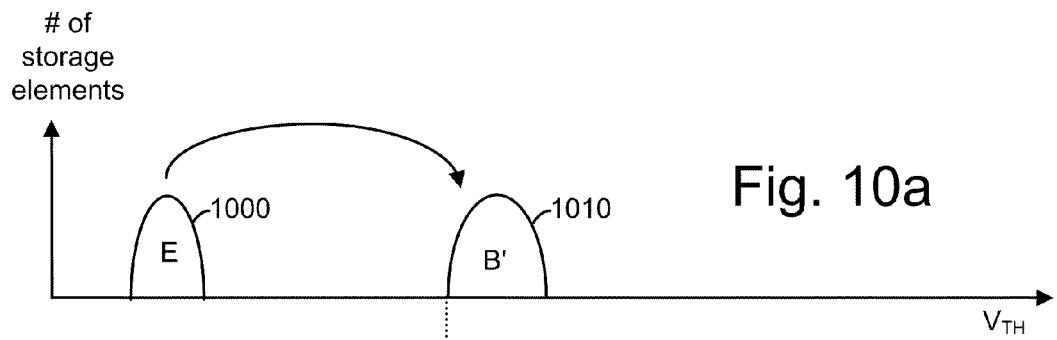
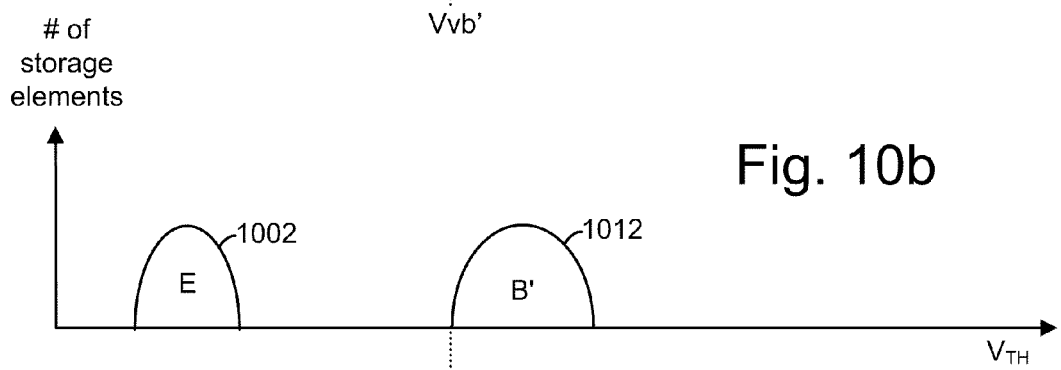
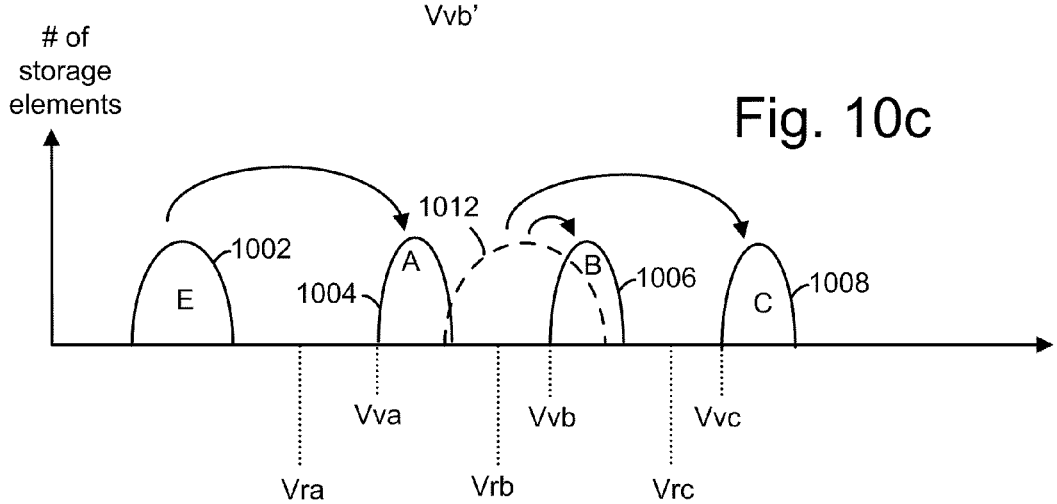

Fig. 11
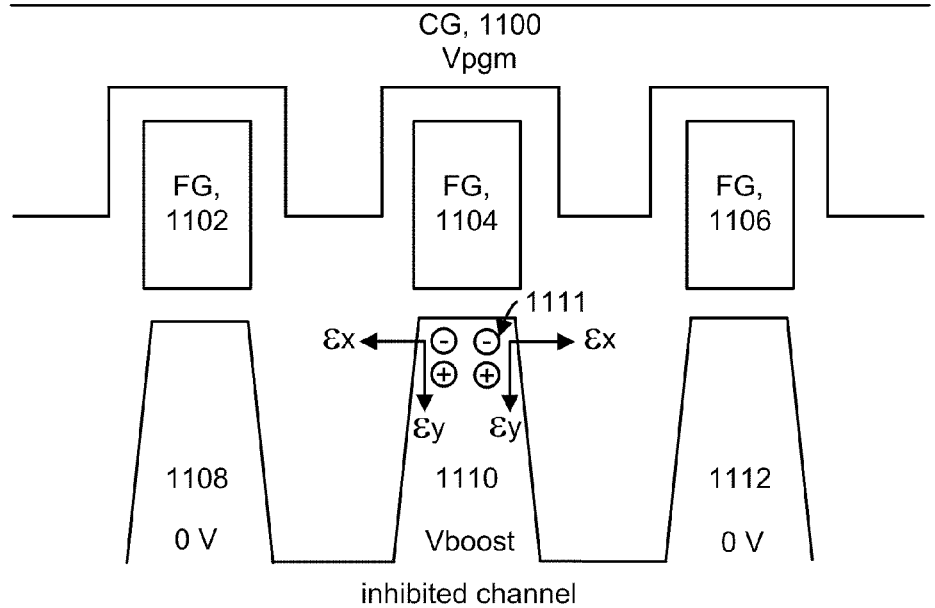
inhibited channel
Fig. 12a
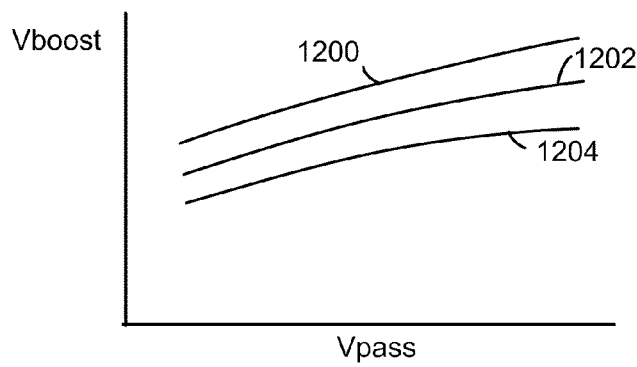
Fig. 12b
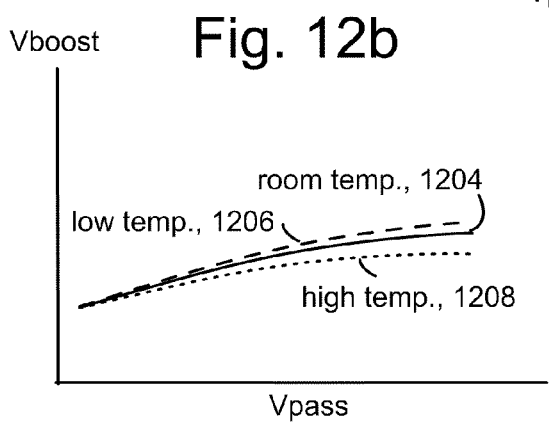
Fig. 12c

REDUCED PROGRAMMING PULSE WIDTH FOR ENHANCED CHANNEL BOOSTING IN NON-VOLATILE STORAGE

BACKGROUND

The present technology relates to non-volatile memory.

Semiconductor memory has become increasingly popular for use in various electronic devices. For example, non-volatile semiconductor memory is used in cellular telephones, digital cameras, personal digital assistants, mobile computing devices, non-mobile computing devices and other devices. Electrically Erasable Programmable Read Only Memory (EEPROM) and flash memory are among the most popular non-volatile semiconductor memories. With flash memory, also a type of EEPROM, the contents of the whole memory array, or of a portion of the memory, can be erased in one step, in contrast to the traditional, full-featured EEPROM.

Both the traditional EEPROM and the flash memory utilize a floating gate that is positioned above and insulated from a channel region in a semiconductor substrate. The floating gate is positioned between the source and drain regions. A control gate is provided over and insulated from the floating gate. The threshold voltage ($V_{TH}$) of the transistor thus formed is controlled by the amount of charge that is retained on the floating gate. That is, the minimum amount of voltage that must be applied to the control gate before the transistor is turned on to permit conduction between its source and drain is controlled by the level of charge on the floating gate.

Some EEPROM and flash memory devices have a floating gate that is used to store two ranges of charges and, therefore, the memory element can be programmed/erased between two states, e.g., an erased state and a programmed state. Such a flash memory device is sometimes referred to as a binary flash memory device because each memory element can store one bit of data.

A multi-state (also called multi-level) flash memory device is implemented by identifying multiple distinct allowed/valid programmed threshold voltage ranges. Each distinct threshold voltage range corresponds to a predetermined value for the set of data bits encoded in the memory device. For example, each memory element can store two bits of data when the element can be placed in one of four discrete charge bands corresponding to four distinct threshold voltage ranges.

Typically, a program voltage $V_{PGM}$ applied to the control gate during a program operation is applied as a series of pulses that increase in magnitude over time. The program voltage can be applied to a selected word line. In one possible approach, the magnitude of the pulses is increased with each successive pulse by a predetermined step size, e.g., 0.2-0.4 V. $V_{PGM}$ can be applied to the control gates of flash memory elements. In the periods between the programming pulses, verify operations are carried out. That is, the programming level of each element of a group of elements being programmed in parallel is read between successive programming pulses to determine whether it is equal to or greater than a verify level to which the element is being programmed. For arrays of multi-state flash memory elements, a verification step may be performed for each state of an element to determine whether the element has reached its data-associated verify level. For example, a multi-state memory element capable of storing data in four states may need to perform verify operations for three compare points.

Moreover, when programming an EEPROM or flash memory device, such as a NAND flash memory device in a NAND string, typically $V_{PGM}$ is applied to the control gate and the bit line is grounded, causing electrons from the channel of a cell or memory element, e.g., storage element, to be injected into the floating gate. When electrons accumulate in the floating gate, the floating gate becomes negatively charged and the threshold voltage of the memory element is raised so that the memory element is considered to be in a programmed state.

However, one issue which continues to be problematic is program disturb. Program disturb can occur at inhibited, unselected NAND strings during programming of other, selected NAND strings. Program disturb occurs when the threshold voltage of an unselected non-volatile storage element is shifted due to programming of other non-volatile storage elements. Program disturb can occur on previously programmed storage elements as well as erased storage elements that have not yet been programmed.

BRIEF DESCRIPTION OF THE DRAWINGS

FIGS. 10a-c show various threshold voltage distributions and describe a process for programming non-volatile memory.

FIG. 11 is a cross section of NAND strings, and depicts channel junction leakage during boosting.

FIG. 12a depicts a channel boosting potential when neighbor channels are boosted or not boosted.

FIG. 12b depicts a channel boosting potential as a function of temperature.

FIG. 12c depicts a channel boosting potential as a function of programming pulse width and selected word line position.

DETAILED DESCRIPTION

A method and non-volatile storage system are provided in which channel boosting is improved by using shorter duration programming pulses, thereby reducing program disturb.

A programming operation switched from using longer duration programming pulses to shorter duration programming pulses partway through a programming operation to reduce program disturb. A switchover point can be based on temperature, selected word line position and/or tracking of storage elements to a trigger state. The switchover point occurs sooner for higher temperatures, and for drain side word lines. The trigger state can be selected based on temperature. Moreover, a portion of storage elements which are required to reach the trigger state to trigger a switchover can also be set a function of temperature.

Figure 1A:
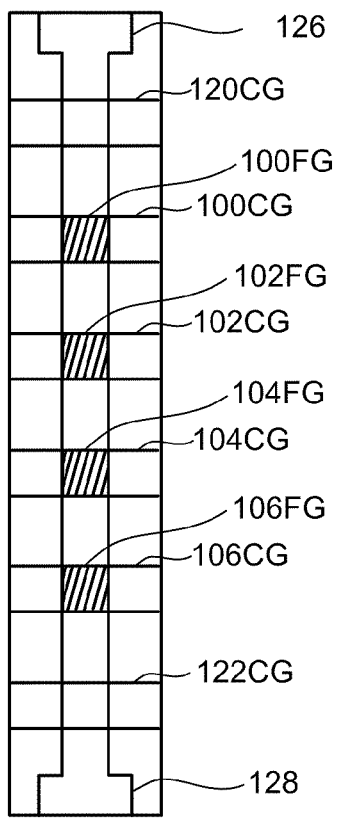
FIG. 1a is a top view of a NAND string.
Figure 1B:
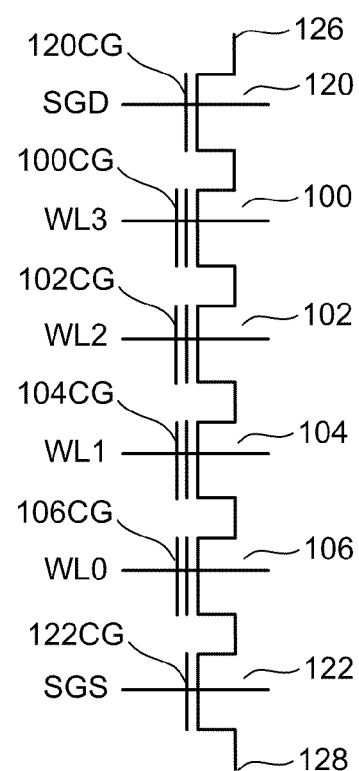
FIG. 1b is an equivalent circuit diagram of the NAND string.

One example of a suitable memory system uses the NAND flash memory structure, which arranges multiple transistors in series between two select gates. The transistors in series and the select gates are referred to as a NAND string. FIG. 1a is a top view showing one NAND string. FIG. 1b is an equivalent circuit thereof. The NAND string depicted includes four transistors, 100, 102, 104 and 106, in series and sandwiched between a first select gate 120 and a second select gate 122. Select gate 120 connects the NAND string to bit line 126. Select gate 122 connects the NAND string to source line 128. Select gate 120 is controlled by applying the appropriate voltages to control gate 120CG. Select gate 122 is controlled by applying the appropriate voltages to control gate 122CG. Each of the transistors 100, 102, 104 and 106 has a control gate and a floating gate. Transistor 100 has control gate 100CG and floating gate 100FG. Transistor 102 includes control gate 102CG and floating gate 102FG. Transistor 104 includes control gate 104CG and floating gate 104FG. Transistor 106 includes a control gate 106CG and floating gate 106FG. Control gate 100CG is connected to word line WL3, control gate 102CG is connected to word line WL2, control gate 104CG is connected to word line WL1, and control gate 106CG is connected to word line WL0. In one embodiment, transistors 100, 102, 104 and 106 are each memory cells. In other embodiments, the memory cells may include multiple transistors or may be different than that depicted. Select gate 120 is connected to select line SGD. Select gate 122 is connected to select line SGS.

Figure 2:
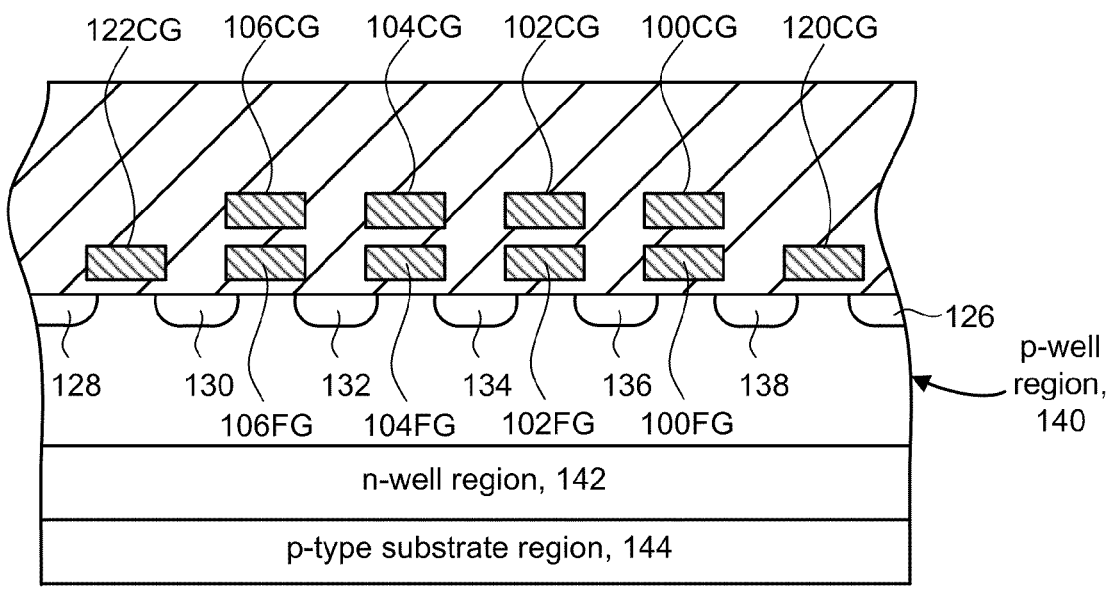
FIG. 2 is a cross-sectional view of the NAND string.

FIG. 2 provides a cross-sectional view of the NAND string described above. The transistors of the NAND string are formed in p-well region 140. The p-well region in turn may be within an n-well region 142 of a p-type substrate 144. Each transistor includes a stacked gate structure that consists of a control gate (100CG, 102CG, 104CG and 106CG) and a floating gate (100FG, 102FG, 104FG and 106FG). The floating gates are formed on the surface of the p-well on top of an oxide or other dielectric film. The control gate is above the floating gate, with an inter-polysilicon dielectric layer separating the control gate and floating gate. The control gates of the memory cells (100, 102, 104 and 106) form the word lines. N+ doped layers 130, 132, 134, 136 and 138 are shared between neighboring cells, whereby the cells are connected to one another in series to form a NAND string. These N+ doped layers form the source and drain of each of the cells. For example, N+ doped layer 130 serves as the drain of transistor 122 and the source for transistor 106, N+ doped layer 132 serves as the drain for transistor 106 and the source for transistor 104, N+ doped layer 134 serves as the drain for transistor 104 and the source for transistor 102, N+ doped layer 136 serves as the drain for transistor 102 and the source for transistor 100, and N+ doped layer 138 serves as the drain for transistor 100 and the source for transistor 120. N+ doped layer 126 connects to the bit line for the NAND string, while N+ doped layer 128 connects to a common source line for multiple NAND strings.

Note that although FIGS. 1a, 1b and 2 show four memory cells in the NAND string, a NAND string used with the technology described herein can have fewer than four memory cells or more than four memory cells. For example, some NAND strings will include 8, 16, 32 or more memory cells.

Each memory cell can store data represented in analog or digital form. When storing one bit of digital data, the range of possible threshold voltages of the memory cell is divided into two ranges, which are assigned logical data "1" and "0." In one example of a NAND-type flash memory, the voltage threshold is negative after the memory cell is erased, and defined as logic "1." The threshold voltage is positive after a program operation, and defined as logic "0." When the threshold voltage is negative and a read is attempted by applying 0 volts to the control gate, the memory cell will turn on to indicate logic one is being stored. When the threshold voltage is positive and a read operation is attempted by applying 0 volts to the control gate, the memory cell will not turn on, which indicates that logic zero is stored.

A memory cell can also store multiple states, thereby storing multiple bits of digital data. In the case of storing multiple states of data, the threshold voltage window is divided into the number of states. For example, if four states are used, there will be four threshold voltage ranges assigned to the data values "11," "10," "01," and "00." In one example of a NAND-type memory, the threshold voltage after an erase operation is negative and defined as "11." Positive threshold voltages are used for the states of "10," "01," and "00." In some implementations, the data values (e.g., logical states) are assigned to the threshold ranges using a Gray code assignment so that if the threshold voltage of a floating gate erroneously shifts to its neighboring physical state, only one bit will be affected. The specific relationship between the data programmed into the memory cell and the threshold voltage ranges of the cell depends upon the data encoding scheme adopted for the memory cells.

Other types of non-volatile memory in addition to NAND flash memory can also be used.

Another type of memory cell useful in flash EEPROM systems utilizes a non-conductive dielectric material in place of a conductive floating gate to store charge in a non-volatile manner. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. A similar cell can be provided in a split-gate configuration where a doped polysilicon gate extends over a portion of the memory cell channel to form a separate select transistor.

In another approach, two bits are stored in each NROM cell, where an ONO dielectric layer extends across the channel between source and drain diffusions. The charge for one data bit is localized in the dielectric layer adjacent to the drain, and the charge for the other data bit localized in the dielectric layer adjacent to the source. Multi-state data storage is obtained by separately reading binary states of the spatially separated charge storage regions within the dielectric.

Figure 3:
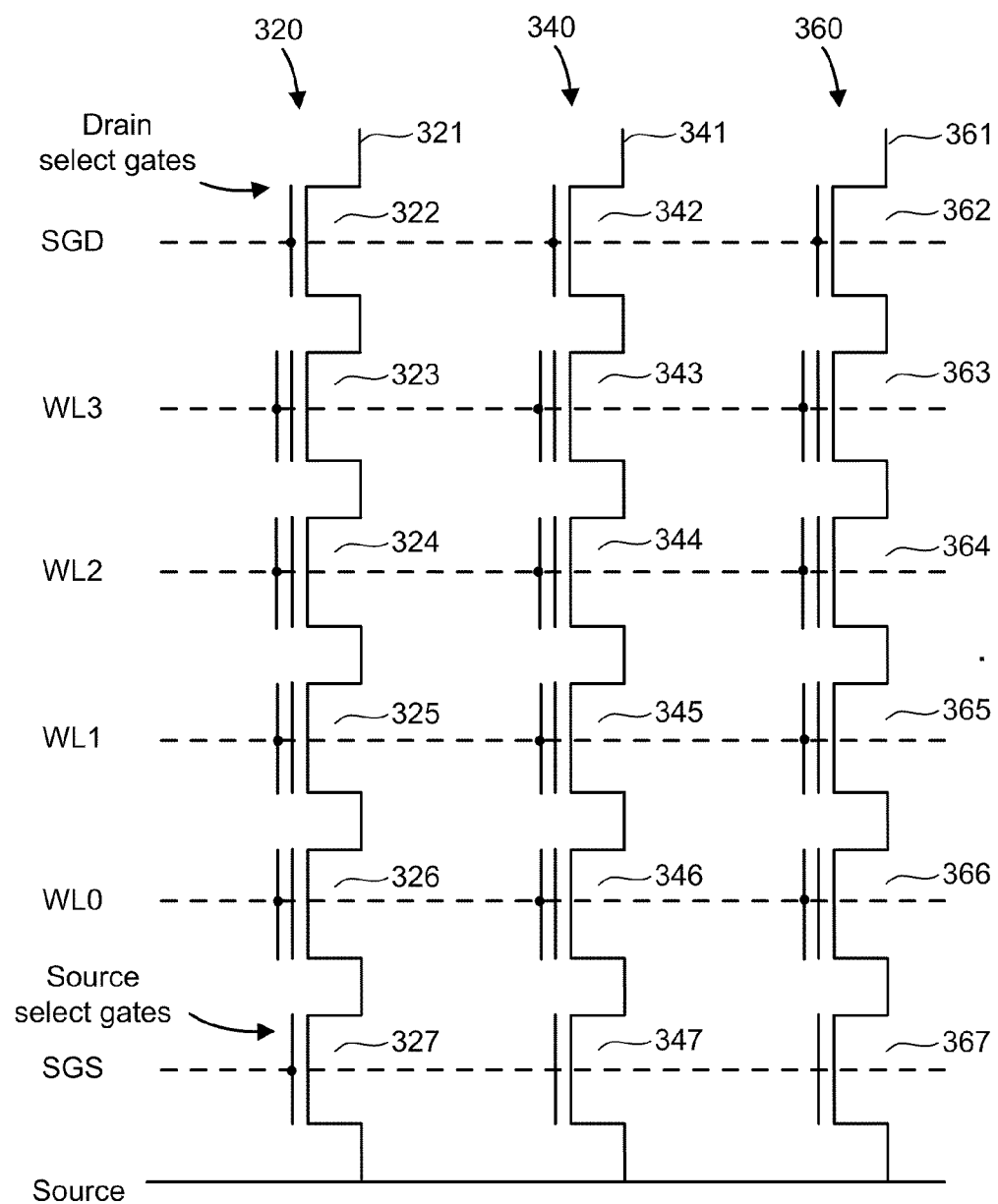
FIG. 3 is a circuit diagram depicting three NAND strings.

FIG. 3 is a circuit diagram depicting three NAND strings. A typical architecture for a flash memory system using a NAND structure will include several NAND strings. For example, three NAND strings 320, 340 and 360 are shown in a memory array having many more NAND strings. Each of the NAND strings includes two select gates and four storage elements. While four storage elements are illustrated for simplicity, modern NAND strings can have up to thirty-two or sixty-four storage elements, for instance.

For example, NAND string 320 includes select gates 322 and 327, and storage elements 323-326, NAND string 340 includes select gates 342 and 347, and storage elements 343-346, NAND string 360 includes select gates 362 and 367, and storage elements 363-366. Each NAND string is connected to the source line by its select gates (e.g., select gates 327, 347 or 367). A selection line SGS is used to control the source side select gates. The various NAND strings 320, 340 and 360 are connected to respective bit lines 321, 341 and 361, by select transistors in the select gates 322, 342, 362, respectively. These select transistors are controlled by a drain select line SGD. In other embodiments, the select lines do not necessarily need to be in common among the NAND strings; that is, different select lines can be provided for different NAND strings. Word line WL3 is connected to the control gates for storage elements 323, 343 and 363. Word line WL2 is connected to the control gates for storage elements 324, 344 and 364. Word line WL1 is connected to the control gates for storage elements 325, 345 and 365. Word line WL0 is connected to the control gates for storage elements 326, 346 and 366. As can be seen, each bit line and the respective NAND string comprise the columns of the array or set of storage elements. The word lines (WL3, WL2, WL1 and WL0) comprise the rows of the array or set. Each word line connects the control gates of each storage element in the row. Or, the control gates may be provided by the word lines themselves. For example, word line WL2 provides the control gates for storage elements 324, 344 and 364. In practice, there can be thousands of storage elements on a word line.

Each storage element can store data. For example, when storing one bit of digital data, the range of possible threshold voltages ($V_{TH}$) of the storage element is divided into two ranges which are assigned logical data "1" and "0." In one example of a NAND type flash memory, the $V_{TH}$ is negative after the storage element is erased, and defined as logic "1." The $V_{TH}$ after a program operation is positive and defined as logic "0." When the $V_{TH}$ is negative and a read is attempted, the storage element will turn on to indicate logic "1" is being stored. When the $V_{TH}$ is positive and a read operation is attempted, the storage element will not turn on, which indicates that logic "0" is stored. A storage element can also store multiple levels of information, for example, multiple bits of digital data. In this case, the range of $V_{TH}$ value is divided into the number of levels of data. For example, if four levels of information are stored, there will be four $V_{TH}$ ranges assigned to the data values "11", "10", "01", and "00." In one example of a NAND type memory, the $V_{TH}$ after an erase operation is negative and defined as "11". Positive $V_{TH}$ values are used for the states of "10", "01", and "00." The specific relationship between the data programmed into the storage element and the threshold voltage ranges of the element depends upon the data encoding scheme adopted for the storage elements.

When programming a flash storage element, a program voltage is applied to the control gate of the storage element, and the bit line associated with the storage element is grounded. Electrons from the channel are injected into the floating gate. When electrons accumulate in the floating gate, the floating gate becomes negatively charged and the $V_{TH}$ of the storage element is raised. To apply the program voltage to the control gate of the storage element being programmed, that program voltage is applied on the appropriate word line. As discussed above, one storage element in each of the NAND strings share the same word line. For example, when programming storage element 324 of FIG. 3, the program voltage will also be applied to the control gates of storage elements 344 and 364.

However, program disturb can occur at inhibited NAND strings during programming of other NAND strings, and sometimes at the programmed NAND string itself. Program disturb occurs when the threshold voltage of an unselected non-volatile storage element is shifted due to programming of other non-volatile storage elements. Program disturb can occur on previously programmed storage elements as well as erased storage elements that have not yet been programmed. Various program disturb mechanisms can limit the available operating window for non-volatile storage devices such as NAND flash memory.

For example, if NAND string 320 is inhibited (e.g., it is an unselected NAND string which does not contain a storage element which is currently being programmed) and NAND string 340 is being programmed (e.g., it is a selected NAND string which contains a storage element which is currently being programmed), program disturb can occur at NAND string 320. For example, if a pass voltage, $V_{PASS}$, is low, the channel of the inhibited NAND string is not well boosted, and a selected word line of the unselected NAND string can be unintentionally programmed. In another possible scenario, the boosted voltage can be lowered by Gate Induced Drain Leakage (GIDL) or other leakage mechanisms, resulting in the same problem. Other effects, such as shifts in the $V_{TH}$ of a charge storage element due to capacitive coupling with other neighboring storage elements that are programmed later, can also contribute to program disturb.

Figure 4:
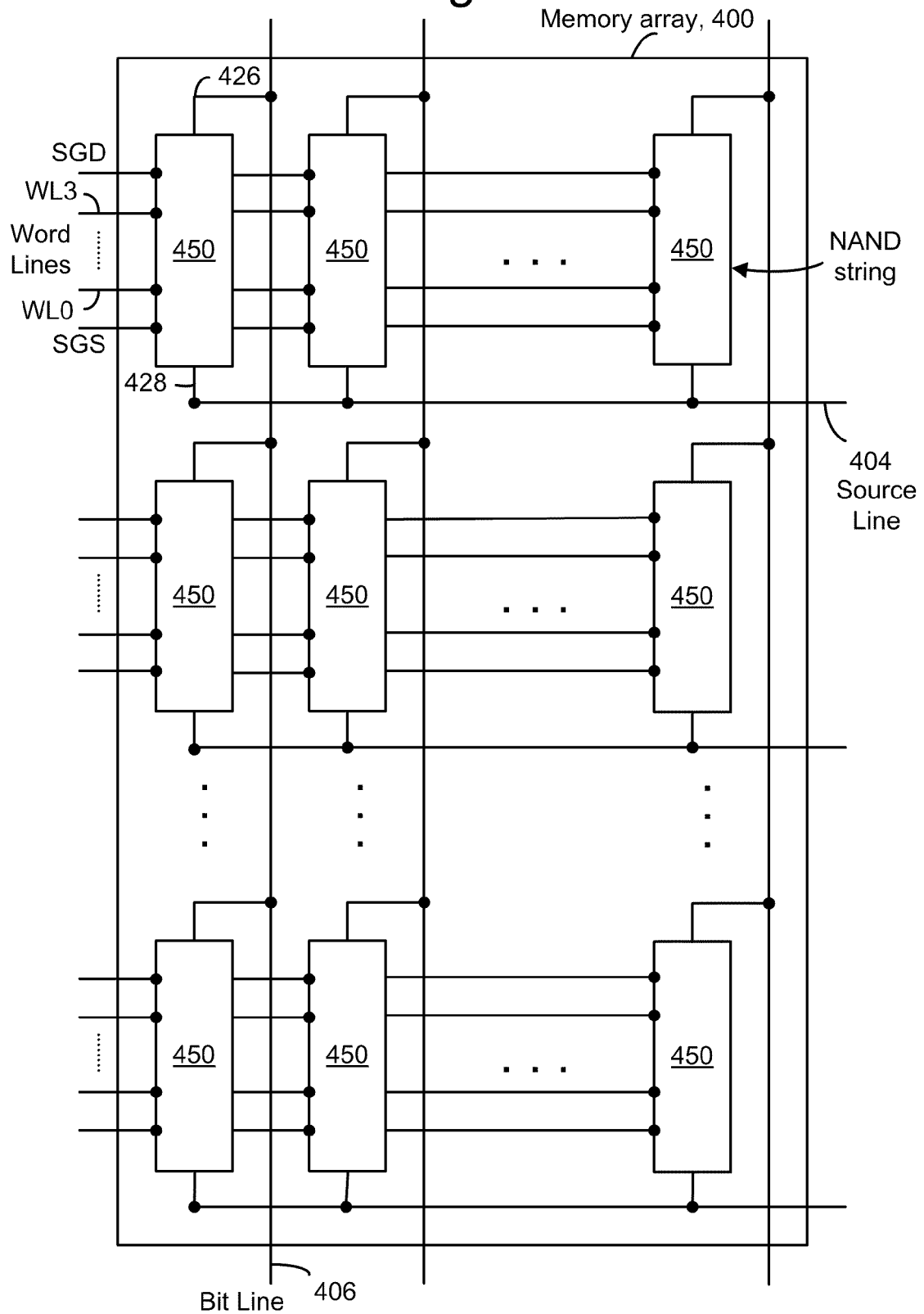
FIG. 4 is a block diagram of an array of NAND flash storage elements.

FIG. 4 illustrates an example of an array 400 of NAND storage elements, such as those shown in FIGS. 1a and 1b. Along each column, a bit line 406 is coupled to the drain terminal 426 of the drain select gate for the NAND string 450. Along each row of NAND strings, a source line 404 may connect all the source terminals 428 of the source select gates of the NAND strings.

The array of storage elements is divided into a large number of blocks of storage elements. As is common for flash EEPROM systems, the block is the unit of erase. That is, each block contains the minimum number of storage elements that are erased together. Each block is typically divided into a number of pages. A page is the smallest unit of programming. One or more pages of data are typically stored in one row of storage elements. For example, a row typically contains several interleaved pages or it may constitute one page. All storage elements of a page will be read or programmed together. Moreover, a page can store user data from one or more sectors. A sector is a logical concept used by the host as a convenient unit of user data; it typically does not contain overhead data, which is confined to the controller. Overhead data may include an Error Correction Code (ECC) that has been calculated from the user data of the sector. A portion of the controller (described below) calculates the ECC when data is being programmed into the array, and also checks it when data is being read from the array. Alternatively, the ECCs and/or other overhead data are stored in different pages, or even different blocks, than the user data to which they pertain.

A sector of user data is typically 512 bytes, corresponding to the size of a sector in magnetic disk drives. Overhead data is typically an additional 16-20 bytes. A large number of pages form a block, anywhere from 8 pages, for example, up to 32, 64, 128 or more pages. In some embodiments, a row of NAND strings comprises a block.

Memory storage elements are erased in one embodiment by raising the p-well to an erase voltage (e.g., 14-22 V) for a sufficient period of time and grounding the word lines of a selected block while the source and bit lines are floating. Due to capacitive coupling, the unselected word lines, bit lines, select lines, and c-source are also raised to a significant fraction of the erase voltage. A strong electric field is thus applied to the tunnel oxide layers of selected storage elements and the data of the selected storage elements are erased as electrons of the floating gates are emitted to the substrate side, typically by Fowler-Nordheim tunneling mechanism. As electrons are transferred from the floating gate to the p-well region, the threshold voltage of a selected storage element is lowered. Erasing can be performed on the entire memory array, separate blocks, or another unit of storage elements.

Figure 5:
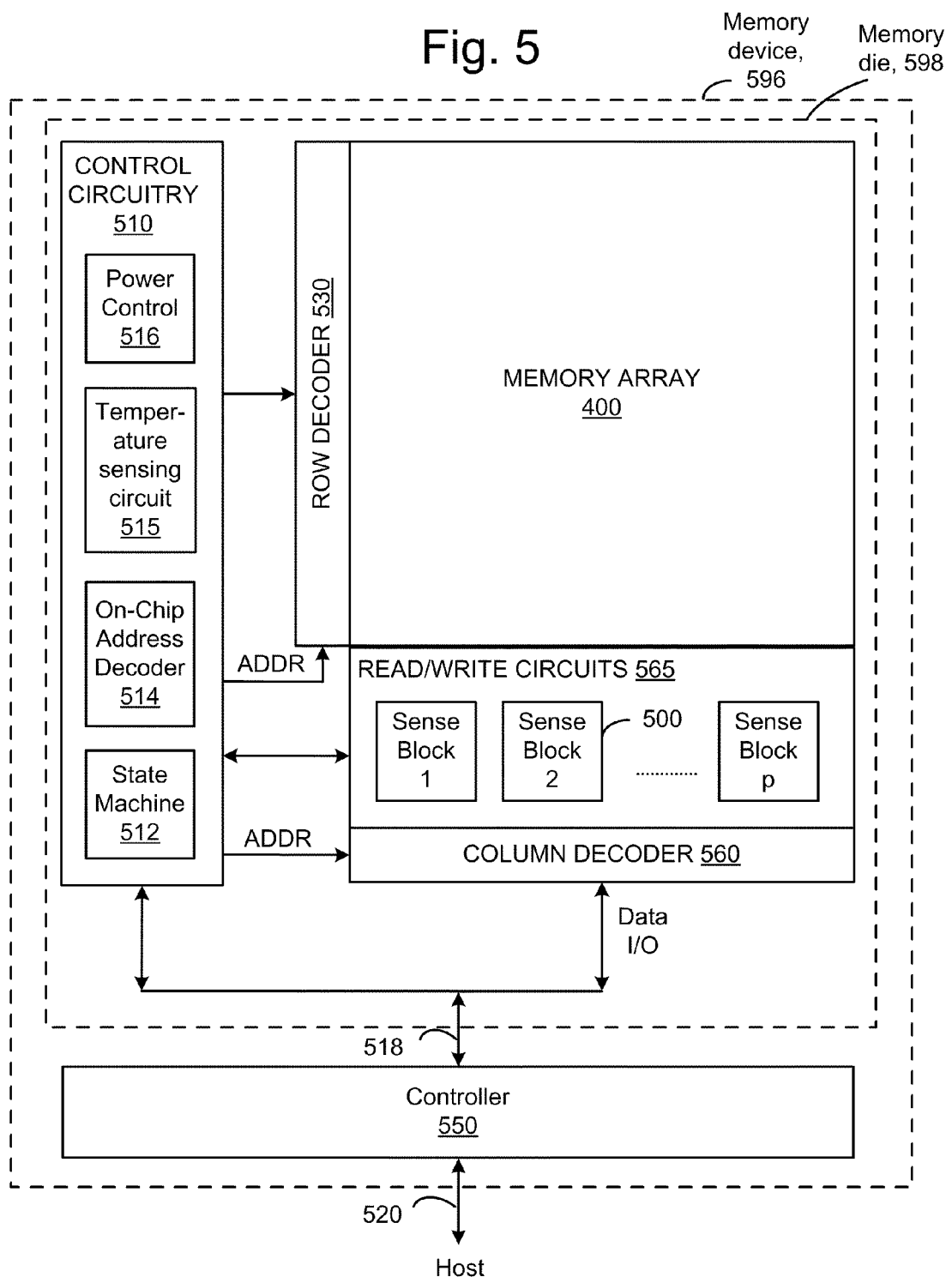
FIG. 5 is a block diagram of a non-volatile memory system using single row/column decoders and read/write circuits.

FIG. 5 is a block diagram of a non-volatile memory system using single row/column decoders and read/write circuits. The diagram illustrates a memory device 596 having read/write circuits for reading and programming a page of storage elements in parallel, according to one embodiment. Memory device 596 may include one or more memory die 598. Memory die 598 includes a two-dimensional array of storage elements 400, control circuitry 510, and read/write circuits 565. In some embodiments, the array of storage elements can be three dimensional. The memory array 400 is addressable by word lines via a row decoder 530 and by bit lines via a column decoder 560. The read/write circuits 565 include multiple sense blocks 500 and allow a page of storage elements to be read or programmed in parallel. Typically a controller 550 is included in the same memory device 596 (e.g., a removable storage card) as the one or more memory die 598. Commands and Data are transferred between the host and controller 550 via lines 520 and between the controller and the one or more memory die 598 via lines 518.

The control circuitry 510 cooperates with the read/write circuits 565 to perform memory operations on the memory array 400. The control circuitry 510 includes a state machine 512, an on-chip address decoder 514, a temperature sensing circuit 515 and a power control module 516. The state machine 512 provides chip-level control of memory operations. The on-chip address decoder 514 provides an address interface between that used by the host or a memory controller to the hardware address used by the decoders 530 and 560. The temperature sensing circuit 515 can be used for providing a temperature based signal or data for use in a programming operation, as discussed herein. The power control module 516 controls the power and voltages supplied to the word lines and bit lines during memory operations.

In some implementations, some of the components of FIG. 5 can be combined. In various designs, one or more of the components (alone or in combination), other than storage element array 400, can be thought of as a managing or control circuit. For example, one or more managing or control circuits may include any one of or a combination of control circuitry 510, state machine 512, decoders 514/560, temperature sensing circuit 515, power control 516, sense blocks 500, read/write circuits 565, controller 550, etc.

Regarding the temperature sensing circuit 515, in present non-volatile storage devices, such as NAND flash memory devices, temperature variations present various issues in reading and writing data. A memory device is subject to varying temperatures based on the environment in which it is located. For example, some current memory devices are rated for use between −30° C. and +85° C. Devices in industrial, military and even consumer applications may experience significant temperature variations.

Various techniques are known for providing temperature-compensated signals. One or more of these techniques can be used to provide a temperature-dependency for VOPTIMAL. Most of these techniques do not rely on obtaining an actual temperature measurement, although this approach is also possible. For example, U.S. Pat. No. 6,801,454, titled "Voltage Generation Circuitry Having Temperature Compensation," incorporated herein by reference, describes a voltage generation circuit which outputs read voltages to a non-volatile memory based on a temperature coefficient. The circuit uses a band gap current which includes a temperature-independent portion and a temperature-dependent portion which increases as temperature increases. U.S. Pat. No. 6,560,152, titled "Non-Volatile Memory With Temperature-Compensated Data Read", incorporated herein by reference, uses a bias generator circuit which biases a voltage which is applied to a source or drain of a data storage element. Any of these techniques, as well as any other known techniques, can be used by the temperature sensing circuit 515.

In another embodiment, a non-volatile memory system uses dual row/column decoders and read/write circuits. Access to the memory array 400 by the various peripheral circuits is implemented in a symmetric fashion, on opposite sides of the array, so that the densities of access lines and circuitry on each side are reduced by half. Thus, the row decoder is split into two row decoders and the column decoder into two column decoders. Similarly, the read/write circuits are split into read/write circuits connecting to bit lines from the bottom and read/write circuits connecting to bit lines from the top of the array 400. In this way, the density of the read/write modules is essentially reduced by one half.

Figure 6:
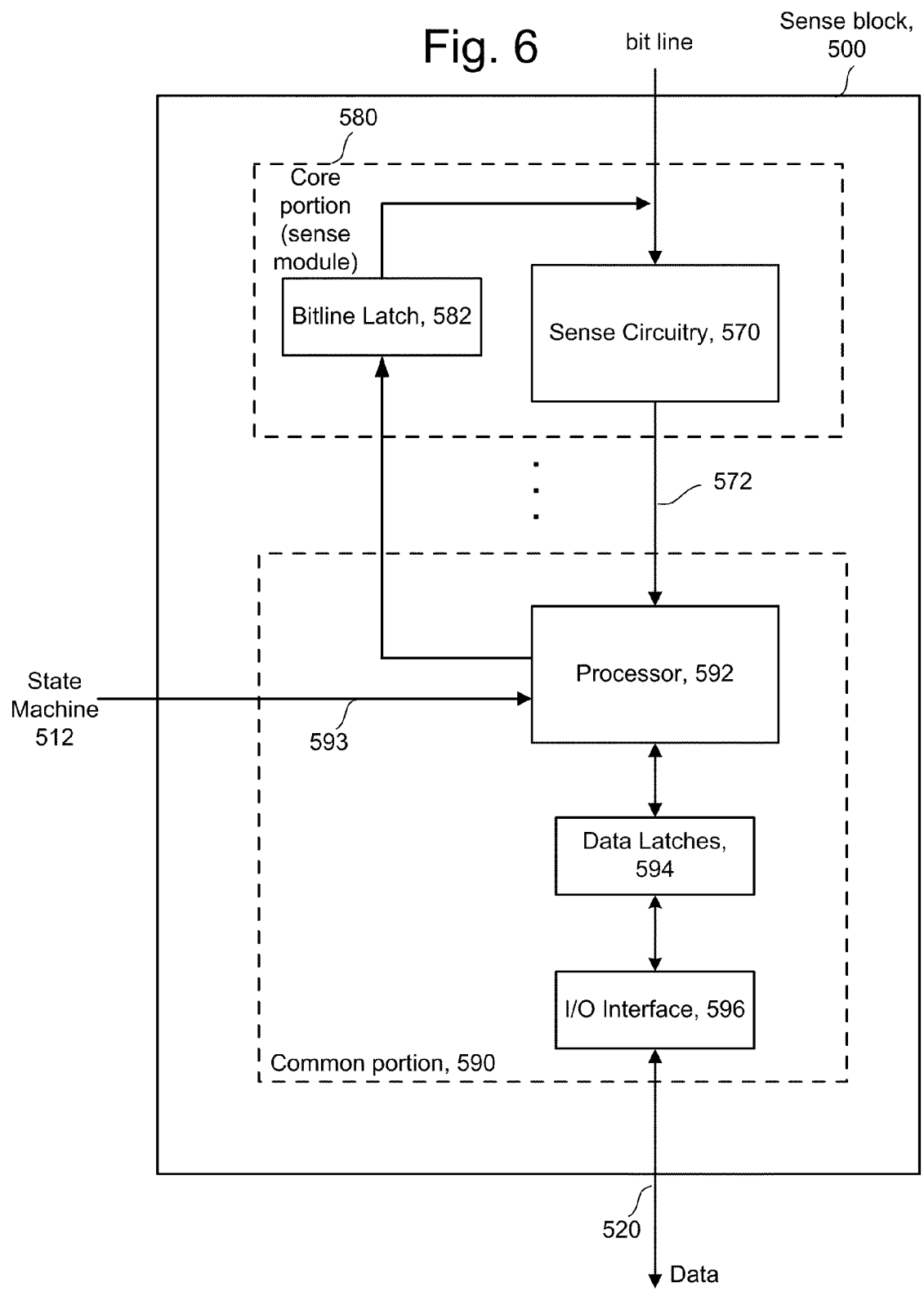
FIG. 6 is a block diagram depicting one embodiment of a sense block.

FIG. 6 is a block diagram depicting one embodiment of a sense block. An individual sense block 500 is partitioned into a core portion, referred to as a sense module 580, and a common portion 590. In one embodiment, there will be a separate sense module 580 for each bit line and one common portion 590 for a set of multiple sense modules 580. In one example, a sense block will include one common portion 590 and eight sense modules 580. Each of the sense modules in a group will communicate with the associated common portion via a data bus 572.

Sense module 580 comprises sense circuitry 570 that determines whether a conduction current in a connected bit line is above or below a predetermined threshold level. Sense module 580 also includes a bit line latch 582 that is used to set a voltage condition on the connected bit line. For example, a predetermined state latched in bit line latch 582 will result in the connected bit line being pulled to a state designating program inhibit (e.g., 1.5-3 V).

Common portion 590 comprises a processor 592, a set of data latches 594 and an I/O Interface 596 coupled between the set of data latches 594 and data bus 520. Processor 592 performs computations. For example, one of its functions is to determine the data stored in the sensed storage element and store the determined data in the set of data latches. The set of data latches 594 is used to store data bits determined by processor 592 during a read operation. It is also used to store data bits imported from the data bus 520 during a program operation. The imported data bits represent write data meant to be programmed into the memory. I/O interface 596 provides an interface between data latches 594 and the data bus 520.

During read or sensing, the operation of the system is under the control of state machine 512 that controls the supply of different control gate voltages to the addressed storage element. As it steps through the various predefined control gate voltages corresponding to the various memory states supported by the memory, the sense module 580 may trip at one of these voltages and an output will be provided from sense module 580 to processor 592 via bus 572. At that point, processor 592 determines the resultant memory state by consideration of the tripping event(s) of the sense module and the information about the applied control gate voltage from the state machine via input lines 593. It then computes a binary encoding for the memory state and stores the resultant data bits into data latches 594. In another embodiment of the core portion, bit line latch 582 serves double duty, both as a latch for latching the output of the sense module 580 and also as a bit line latch as described above.

Some implementations can include multiple processors 592. In one embodiment, each processor 592 will include an output line (not depicted) such that each of the output lines is wired-OR'd together. In some embodiments, the output lines are inverted prior to being connected to the wired-OR line. This configuration enables a quick determination during the program verification process of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense modules, the state machine needs to read the wired-OR line eight times, or logic is added to processor 592 to accumulate the results of the associated bit lines such that the state machine need only read the wired-OR line one time. Similarly, by choosing the logic levels correctly, the global state machine can detect when the first bit changes its state and change the algorithms accordingly.

During program or verify, the data to be programmed is stored in the set of data latches 594 from the data bus 520. The program operation, under the control of the state machine, comprises a series of programming voltage pulses applied to the control gates of the addressed storage elements. Each programming pulse is followed by a read back (verify) to determine if the storage element has been programmed to the desired memory state. Processor 592 monitors the read back memory state relative to the desired memory state. When the two are in agreement, the processor 592 sets the bit line latch 582 so as to cause the bit line to be pulled to a state designating program inhibit. This inhibits the storage element coupled to the bit line from further programming even if programming pulses appear on its control gate. In other embodiments the processor initially loads the bit line latch 582 and the sense circuitry sets it to an inhibit value during the verify process.

Data latch stack 594 contains a stack of data latches corresponding to the sense module. In one embodiment, there are three data latches per sense module 580. In some implementations (but not required), the data latches are implemented as a shift register so that the parallel data stored therein is converted to serial data for data bus 520, and vice versa. In the preferred embodiment, all the data latches corresponding to the read/write block of m storage elements can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

Figure 7:
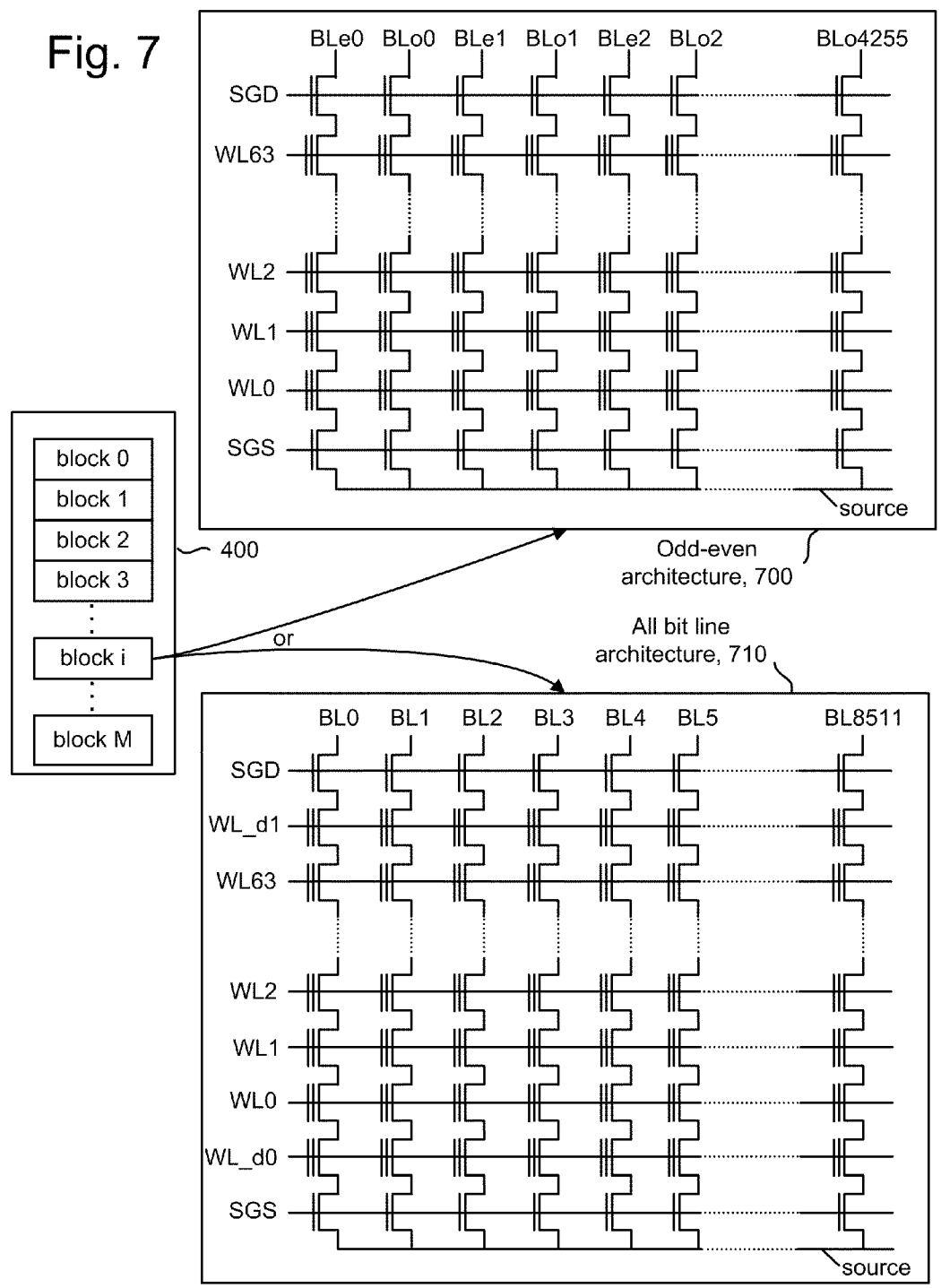
FIG. 7 illustrates an example of an organization of a memory array into blocks for an all bit line memory architecture or for an odd-even memory architecture.

FIG. 7 illustrates an example of an organization of a memory array into blocks for an all bit line memory architecture or for an odd-even memory architecture. Exemplary structures of memory array 400 are described. As one example, a NAND flash EEPROM is described that is partitioned into 1,024 blocks. The data stored in each block can be simultaneously erased. In one embodiment, the block is the minimum unit of storage elements that are simultaneously erased. In each block, in this example, there are 8,512 columns corresponding to bit lines BL0, BL1, . . . BL8511. In one embodiment referred to as an all bit line (ABL) architecture (architecture 710), all the bit lines of a block can be simultaneously selected during read and program operations. Storage elements along a common word line and connected to any bit line can be programmed at the same time.

In the example provided, four storage elements are connected in series to form a NAND string. Although four storage elements are shown to be included in each NAND string, more or less than four can be used (e.g., 16, 32, 64 or another number). One terminal of the NAND string is connected to a corresponding bit line via a drain select gate (connected to select gate drain lines SGD), and another terminal is connected to c-source via a source select gate (connected to select gate source line SGS).

In another embodiment, referred to as an odd-even architecture (architecture 700), the bit lines are divided into even bit lines (BLe) and odd bit lines (BLo). In the odd/even bit line architecture, storage elements along a common word line and connected to the odd bit lines are programmed at one time, while storage elements along a common word line and connected to even bit lines are programmed at another time. In each block, in this example, there are 8,512 columns that are divided into even columns and odd columns, and sixty-four storage elements are shown connected in series in a column to form a NAND string.

During one configuration of read and programming operations, 4,256 storage elements are simultaneously selected. The storage elements selected have the same word line and the same kind of bit line (e.g., even or odd). Therefore, 532 bytes of data, which form a logical page, can be read or programmed simultaneously, and one block of the memory can store at least eight logical pages (four word lines, each with odd and even pages). For multi-state storage elements, when each storage element stores two bits of data, where each of these two bits are stored in a different page, one block stores sixteen logical pages. Other sized blocks and pages can also be used.

For either the ABL or the odd-even architecture, storage elements can be erased by raising the p-well to an erase voltage (e.g., 20 V) and grounding the word lines of a selected block. The source and bit lines are floating. Erasing can be performed on the entire memory array, separate blocks, or another unit of the storage elements which is a portion of the memory device. Electrons are transferred from the floating gates of the storage elements to the p-well region so that the $V_{TH}$ of the storage elements becomes negative.

In the read and verify operations, the select gates (SGD and SGS) are connected to a voltage in a range of 2.5-4.5 V and the unselected word lines (e.g., WL0, WL1 and WL3, when WL2 is the selected word line) are raised to a read pass voltage, $V_{READ}$, (typically a voltage in the range of 4.5 to 6 V) to make the transistors operate as pass gates. The selected word line WL2 is connected to a voltage, a level of which is specified for each read and verify operation in order to determine whether a $V_{TH}$ of the concerned storage element is above or below such level. For example, in a read operation for a two-level storage element, the selected word line WL2 may be grounded, so that it is detected whether the $V_{TH}$ is higher than 0 V. In a verify operation for a two level storage element, the selected word line WL2 is connected to 0.8 V, for example, so that it is verified whether or not the $V_{TH}$ has reached at least 0.8 V. The source and p-well are at 0 V. The selected bit lines, assumed to be the even bit lines (BLe), are pre-charged to a level of, for example, 0.7 V. If the $V_{TH}$ is higher than the read or verify level on the word line, the potential level of the bit line (BLe) associated with the storage element of interest maintains the high level because of the non-conductive storage element. On the other hand, if the $V_{TH}$ is lower than the read or verify level, the potential level of the concerned bit line (BLe) decreases to a low level, for example, less than 0.5 V, because the conductive storage element discharges the bit line. The state of the storage element can thereby be detected by a voltage comparator sense amplifier that is connected to the bit line.

Figure 8:
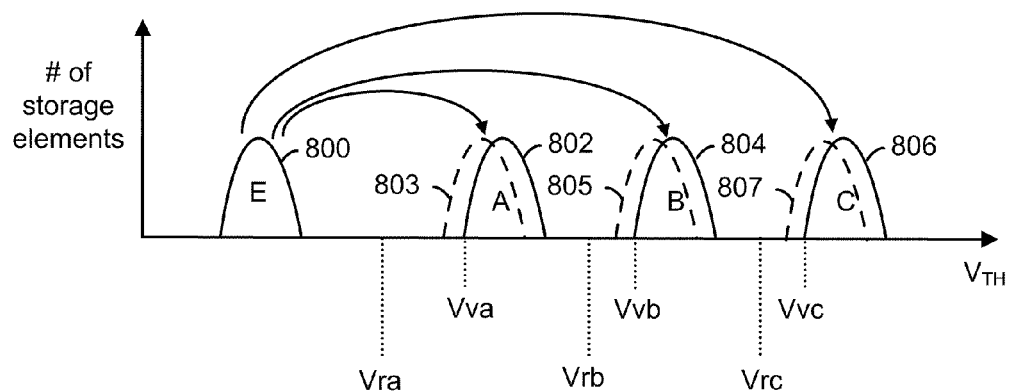
FIG. 8 depicts an example set of threshold voltage distributions and one-pass programming.

FIG. 8 depicts an example set of threshold voltage distributions and one-pass programming. Example threshold voltage distributions for the storage element array are provided for a case where each storage element stores two bits of data. A first threshold voltage distribution 800 is provided for erased (E state) storage elements. Three threshold voltage distributions 802, 804 and 806 represent programmed states A, B and C, respectively. In one embodiment, the threshold voltages in the E distribution are negative and the threshold voltages in the A, B and C distributions are positive. Distributions 803, 805 and 807 represent temporary or transient distributions which the A, B and C state storage elements, respectively, undergo before reaching the final distributions 802, 804 and 806, respectively. For instance, the distribution 803 indicates that a certain number or portion of A-state storage element, or storage elements which are intended to be programmed to the A state, are currently in the A state. These storage elements, for which $V_{TH}$>Vva, have been verified to reach the A state. The remainder of the A state storage element have $V_{TH}$<Vva, and have not yet reached the A state.

Similarly, distribution 805 indicates that a certain number or portion of B-state storage elements are currently in the B state, and distribution 807 indicates that a certain number or portion of C-state storage elements are currently in the C state. The number of storage elements which are in a particular state can be determined by maintaining a count of storage elements whose threshold voltage is determined to exceed the corresponding verify level.

Each distinct threshold voltage range corresponds to predetermined values for the set of data bits. The specific relationship between the data programmed into the storage element and the threshold voltage levels of the storage element depends upon the data encoding scheme adopted for the storage elements. In one embodiment, data values are assigned to the threshold voltage ranges using a Gray code assignment so that if the threshold voltage of a floating gate erroneously shifts to its neighboring physical state, only one bit will be affected. One example assigns "11" to threshold voltage range E (state E), "10" to threshold voltage range A (state A), "00" to threshold voltage range B (state B) and "01" to threshold voltage range C (state C). However, in other embodiments, Gray code is not used. Although four states are shown, the other multi-state structures including those that include more or less than four states can also be used.

Three read reference voltages, Vra, Vrb and Vrc, are also provided for reading data from storage elements. By testing whether the threshold voltage of a given storage element is above or below Vra, Vrb and Vrc, the system can determine the state, e.g., programming condition, the storage element is in.

Further, three verify reference voltages, Vva, Vvb and Vvc, are provided. When programming storage elements to state A, the system will test whether those storage elements have a threshold voltage greater than or equal to Vva. When programming storage elements to state B, the system will test whether the storage elements have threshold voltages greater than or equal to Vvb. When programming storage elements to state C, the system will determine whether storage elements have their threshold voltage greater than or equal to Vvc.

In one embodiment, known as full sequence programming, storage elements can be programmed from the erase state E directly to any of the programmed states A, B or C. For example, a population of storage elements to be programmed may first be erased so that all storage elements in the population are in erased state E. A series of programming pulses such as depicted by the control gate voltage sequence of FIG. 13 will then be used to program storage elements directly into states A, B or C. While some storage elements are being programmed from state E to state A, other storage elements are being programmed from state E to state B and/or from state E to state C. When programming from state E to state C on WLn, the amount of parasitic coupling to the adjacent floating gate under WLn−1 reaches a maximum since the change in amount of charge on the floating gate under WLn is the largest as compared to the change in charge when programming from state E to state A or state E to state B. When programming from state E to state B the amount of coupling to the adjacent floating gate is less. When programming from state E to state A the amount of coupling is reduced even further.

Figure 9:
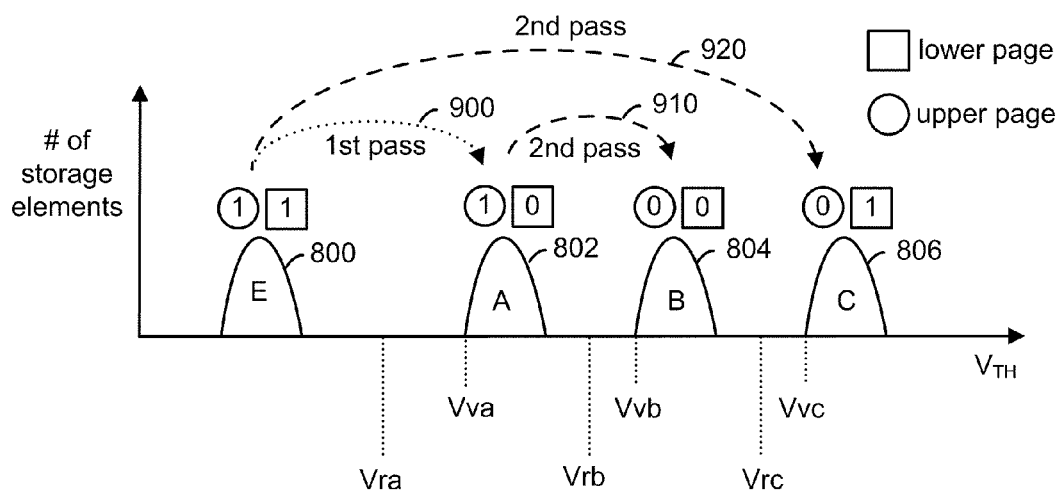
FIG. 9 depicts an example set of threshold voltage distributions and two-pass programming.

FIG. 9 illustrates an example of a two-pass technique of programming a multi-state storage element that stores data for two different pages: a lower page and an upper page. Four states are depicted by repeating the threshold voltage distributions 800, 802, 804 and 806 from FIG. 8. These states, and the bits they represent, are: state E (11), state A (10), state B (00) and state C (01). For state E, both pages store a "1." For state A, the lower page stores a "0" and the upper page stores a "1." For state B, both pages store "0." For state C, the lower page stores "1" and the upper page stores "0." Note that although specific bit patterns have been assigned to each of the states, different bit patterns may also be assigned.

In a first programming pass, the storage element's threshold voltage level is set according to the bit to be programmed into the lower logical page. If that bit is a logic "1," the threshold voltage is not changed since it is in the appropriate state as a result of having been earlier erased. However, if the bit to be programmed is a logic "0," the threshold level of the storage element is increased to be state A, as shown by arrow 900. That concludes the first programming pass.

In a second programming pass, the storage element's threshold voltage level is set according to the bit being programmed into the upper logical page. If the upper logical page bit is to store a logic "1," then no programming occurs since the storage element is in one of the states E or A, depending upon the programming of the lower page bit, both of which carry an upper page bit of "1." If the upper page bit is to be a logic "0," then the threshold voltage is shifted. If the first pass resulted in the storage element remaining in the erased state E, then in the second phase the storage element is programmed so that the threshold voltage is increased to be within state C, as depicted by arrow 920. If the storage element had been programmed into state A as a result of the first programming pass, then the storage element is further programmed in the second pass so that the threshold voltage is increased to be within state B, as depicted by arrow 910. The result of the second pass is to program the storage element into the state designated to store a logic "0" for the upper page without changing the data for the lower page. In both FIG. 8 and FIG. 9, the amount of coupling to the floating gate on the adjacent word line depends on the final state.

In one embodiment, a system can be set up to perform full sequence writing if enough data is written to fill up an entire page. If not enough data is written for a full page, then the programming process can program the lower page programming with the data received. When subsequent data is received, the system will then program the upper page. In yet another embodiment, the system can start writing in the mode that programs the lower page and convert to full sequence programming mode if enough data is subsequently received to fill up an entire (or most of a) word line's storage elements.

Note that the distributions 802, 804 and 806 in FIG. 9 can have associated temporary or interim distributions (shown in FIG. 8) which the A, B and C state storage elements undergo before reaching the final distributions 802, 804 and 806, respectively.

FIGS. 10*a-c* disclose another process for programming non-volatile memory that reduces the effect of floating gate to floating gate coupling by, for any particular storage element, writing to that particular storage element with respect to a particular page subsequent to writing to adjacent storage elements for previous pages. In one example implementation, the non-volatile storage elements store two bits of data per storage element, using four data states. For example, assume that state E is the erased state and states A, B and C are the programmed states. State E stores data 11. State A stores data 01. State B stores data 10. State C stores data 00. This is an example of non-Gray coding because both bits change between adjacent states A and B. Other encodings of data to physical data states can also be used. Each storage element stores two pages of data. For reference purposes, these pages of data will be called upper page and lower page; however, they can be given other labels. With reference to state A, the upper page stores bit 0 and the lower page stores bit 1. With reference to state B, the upper page stores bit 1 and the lower page stores bit 0. With reference to state C, both pages store bit data 0.

The programming process is a two-step process. In the first step, the lower page is programmed. If the lower page is to remain data 1, then the storage element state remains at state E (distribution 1000). If the data is to be programmed to 0, then the threshold of voltage of the storage element is raised such that the storage element is programmed to state B' (distribution 1010). FIG. 10*a* therefore shows the programming of storage elements from state E to state B'. State B' is an interim state B; therefore, the verify point is depicted as Vvb', which is lower than Vvb.

Note that the distribution 1010 can have an associated temporary or interim distribution (not shown) which the B' state storage elements undergo before reaching the distribution 1010.

In one embodiment, after a storage element is programmed from state E to state B', its neighbor storage element (WLn+1) in the NAND string will then be programmed with respect to its lower page. For example, looking back at FIG. 2, after the lower page for storage element 106 is programmed, the lower page for storage element 104 would be programmed. After programming storage element 104, the floating gate to floating gate coupling effect will raise the apparent threshold voltage of storage element 106 if storage element 104 had a threshold voltage raised from state E to state B'. This will have the effect of widening the threshold voltage distribution for state B' to that depicted as threshold voltage distribution 1012 of FIG. 10*b*. This apparent widening of the threshold voltage distribution will be remedied when programming the upper page. The E state may also be widened, to a lesser extent, as depicted by distribution 1002.

FIG. 10*c* depicts the process of programming the upper page. If the storage element is in erased state E and the upper page is to remain at 1, then the storage element will remain in state E (distribution 1002). If the storage element is in state E and its upper page data is to be programmed to 0, then the threshold voltage of the storage element will be raised so that the storage element is in state A (distribution 1004). If the storage element was in intermediate threshold voltage distribution 1012 and the upper page data is to remain at 1, then the storage element will be programmed to final state B (distribution 1006). If the storage element is in intermediate threshold voltage distribution 1012 and the upper page data is to become data 0, then the threshold voltage of the storage element will be raised so that the storage element is in state C (distribution 1008). The process depicted by FIGS. 10*a-c* reduces the effect of floating gate to floating gate coupling because only the upper page programming of neighbor storage elements will have an effect on the apparent threshold voltage of a given storage element. An example of an alternate state coding is to move from distribution 1012 to state C when the upper page data is a 1, and to move to state B when the upper page data is a 0.

Note that the distributions 1004, 1006 and 1008 can have associated temporary or interim distributions which the A, B and C state storage elements undergo as they transition to the final distributions 1004, 1006 and 1008, respectively.

Although FIGS. 10*a-c* provide an example with respect to four data states and two pages of data, the concepts taught can be applied to other implementations with more or fewer than four states and more or less than two pages. For example, memory devices with eight or sixteen states per storage element are currently planned or in production.

FIG. 11 is a cross section of NAND strings, and depicts channel junction leakage during boosting. The cross section depicts a control gate (CG) or selected word line 1100 which extends across multiple storage elements. Each storage element includes a floating gate (FG), e.g., FGs 1102, 1104 and 1106, which is over a respective channel area 1108, 1110, 1112 of the substrate, typically in a p-well. Each channel region is part of a NAND string which can be visualized as coming out of the page. In this example, the channel area 1110 is of an inhibited string, and the channel areas 1108 and 1112 are of programmed strings. Vboost>0 V represents a boosted voltage potential of the channel area 1110.

As mentioned above in connection with FIG. 3, storage elements which are in unselected NAND strings have their channels boosted during programming operations to inhibit programming and thereby avoid program disturb. Boosting is typically accomplished by applying a pass voltage, Vpass, to unselected word lines while a program voltage, Vpgm, is applied to a selected word line. However, Vpass cannot be too high or it may program the unselected NAND strings. Boosting inhibits programming of a floating gate by reducing the voltage across the floating gate. The inhibited storage elements which are most susceptible to program disturb are those which communicate with the selected word line 1100 and therefore receive a relatively high program voltage, Vpgm. The inhibited storage elements which communicate with unselected word lines have a lower pass voltage, Vpass, on their control gates instead of a program voltage and are therefore substantially less susceptible to program disturb.

As NAND flash memory continues to scale down, channel boosting tends to become more difficult because the coupling between two neighboring channels becomes stronger. Channel boosting potential can saturate or clamp at a certain level above which it can not increase much, even if Vpass is further increased. For a given storage element which is being inhibited, this channel boosting saturation is most severe when the channels of the two neighboring storage elements connected to the same word line stay at a low voltage, such as 0 V, as is the case when both neighboring storage elements are being programmed. For example, channel 1110 is inhibited by a boost voltage, Vboost, and channels 1108 and 1112 are not inhibited, receiving, e.g., 0 V. In some cases, such as the fine phase of a coarse-fine programming operation, the channel of a selected NAND string can be raised slightly above 0 V, such as to 0.5 V, to slow down programming. However, this level is also significantly less than Vboost, which can be several Volts.

This boosting potential saturation can cause a severe program disturb problem. For example, when some storage elements on a word line are programmed to a high threshold voltage, such as in three-and four-bit per storage element memory devices, the program voltage can increase to a very high level, but the channel potential can not be increased sufficiently due to boosting saturation. Program disturb can easily occur in this and other programming scenarios.

In particular, channel boosting saturation can be caused by junction leakage in the source/drain region of a storage element when channel boosting potential is high. However, when the programming pulse width is reduced, the boosting saturation can be improved, so that the boosting potential becomes higher. This is likely due to a shorter junction leakage duration time. The potential in the neighboring channel can strongly modulate the lateral electric field ex in the center boosted channel and affect the junction leakage. If we look at the shallow trench isolation as a gate oxide and the neighbor channel as a gate, this effect is a little similar to gate induced drain leakage in which leakage is strongly modulated by gate voltage. The vertical electric field $\in y$ is also depicted. Electron-hole pairs 1111 are generated by a strong electric field.

FIG. 12a depicts a channel boosting potential when neighbor channels are boosted or not boosted. The horizontal axis depicts a pass voltage (Vpass) applied to unselected word lines, and the vertical axis depicts a channel boosting potential (Vboost) of an inhibited/boosted channel, such as channel 1110 in FIG. 11. The channel boosting potential depends on the neighboring channels' potential. When both of the neighboring channels are inhibited (curve 1200), Vboost is highest. When one of the neighboring channels is inhibited/boosted, and the other neighboring channels is conducting/unboosted (curve 1202), with the channel potentials at 0 V, Vboost is second highest. When both of the neighboring channels are conducting (curve 1204), Vboost is lowest, which is the worst case. In some cases, curves 1200 and 1204 can differ by at least 2 V, when boosting in the range of several Volts is used.

FIG. 12b depicts a channel boosting potential as a function of temperature. Boosting saturation has a strong temperature dependence. At high temperatures, the boosting becomes more difficult, and the channel potential saturates at a lower level due to a high reverse bias leakage current in the channel. At low temperatures, the reverse bias leakage current is much lower, so the situation is improved and a higher Vboost can be achieved. In the graph shown, for a given channel, both of the neighboring channels are conducting. The case of room temperature corresponds to curve 1204 which is also depicted in FIG. 12a. Curve 1206 represents Vboost as a function of Vpass at a lower temperature such as −30° C. and curve 1208 represents Vboost as a function of Vpass at a higher temperature such as +85° C. As mentioned, Vboost is lower at higher temperatures.

FIG. 12c depicts a channel boosting potential as a function of programming pulse width and selected word line position. A reduced programming pulse width or duration can improve the boosting saturation so that a higher boosting potential can be achieved. This is likely due to the junction leakage duration becoming shorter. Here, the horizontal axis depicts the programming pulse (Vpgm) width and the vertical axis depicts Vboost. Generally, a shorter pulse width correlates with a higher Vboost.

Reducing the programming pulse width, such as to one-half or one-third of a nominal width, can increase Vboost by a significant amount, thereby significantly reducing program disturb. In one case, reducing a programming pulse width from 20 μs to 10 μs increased Vboost by about 0.5 V—a substantial increase. A lower practical limit on the programming pulse width is imposed as discussed further in connection with FIG. 14.

Moreover, the channel can often saturate earlier when the selected word line is a drain side word line (curve 1214) than a middle word line (curve 1212) or source side word line (curve 1210). This is true, e.g., for some boosting schemes in which an isolation voltage such as 0 V is applied to at least one word line on a source side of the selected word line during the programming pulses. The isolation voltage cuts off the source side of the channel from the drain side, and during the drain side programming, the channel capacitance can become smaller so the boosting is lower. So, switching to a shorter pulse width can occur sooner for the higher word lines.

Specifically, Vboost is lower for a given Vpgm pulse width, for a drain side selected word line. Using a word line numbering scheme such as shown in FIG. 7, the furthest source side word line is WL0 (word line number 0) and the word line number increases until the furthest drain side word line is reached, which is WL63 in the example. A source side word line can encompass word lines which are within a number Nss word lines of the furthest source side word line. A drain side word line can encompass word lines which are within a number Nds word lines of the furthest drain side word line. A middle word line can encompass word lines which are between the source and drain side word lines. Note that the word line which is selected for programming is referenced here.

Shortening the programming pulse duration can increase the number of programming pulses which are need to complete a programming operation, and the programming pulse may reach a higher amplitude than if longer duration pulses were used. However, a shorter pulse duration can result in a finer-grained programming operation since the threshold voltage of a storage element is increased in smaller increments. Further, storage elements can be locked out sooner after they pass the verify test after each short pulse. Overall programming time is not expected to increase significantly.

Figure 12D:
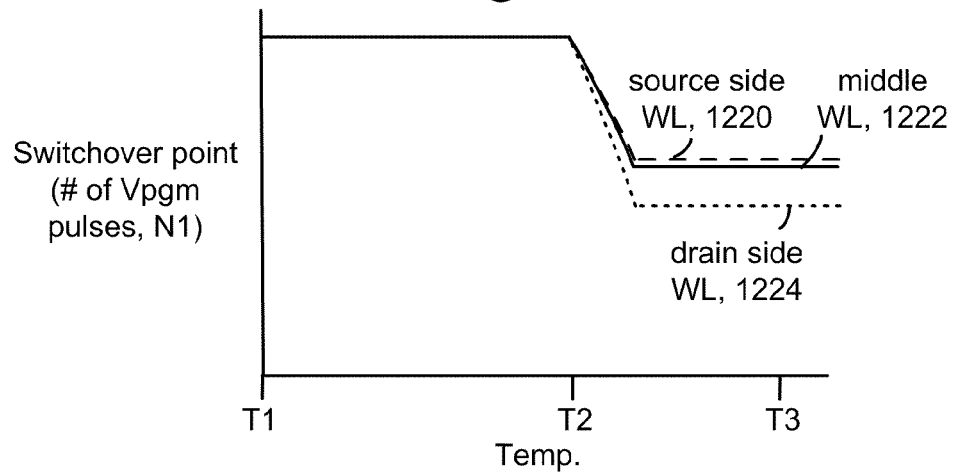
FIG. 12d depicts a switchover point in terms of a number of programming pulses as a function of temperature and selected word line position.

FIG. 12d depicts a switchover point in terms of a number of programming pulses (vertical axis) as a function of temperature (horizontal axis), with an adjustment based on selected word line position. As mentioned, one approach to achieving a higher Vboost, for a given inhibited channel, is to use programming pulses with a reduced duration. Conceptually, this involves dividing a long programming pulse into two or more shorter pulses. A switchover from a longer duration programming pulse to a shorter duration programming pulse can occur partway through a programming operation based on one or more criterion. One possible approach is to switch at a predetermined programming pulse number, that is, at a certain N1st programming pulse which is applied in a programming operation. See also FIG. 13, discussed further below. Essentially, the switchover occurs when the programming pulse amplitude reaches a predetermined level, as the pulse number typically corresponds to a pulse amplitude.

A finer grained approach accounts for temperature and/or selected word line position. For example, in FIG. 12d, curve 1224 depicts N1 versus temperature when the selected word line is a drain side word line, curve 1222 depicts N1 versus temperature when the selected word line is a middle word line, and curve 1220 depicts N1 versus temperature when the selected word line is a source side word line. At lower to mid-range temperatures, between temperatures T1 and T2, the curves are coincident, and a higher N1 can be used so that a switchover to a shorter duration programming pulse is made relatively later in the programming operation, when the programming pulse has reached a higher amplitude. At higher temperatures, such as between T2 and T3, a lower N1 can be used so that a switchover to a shorter duration programming pulse is made relatively sooner in the programming operation, when the programming pulse has not reached as high of an amplitude. By using this scheme, the problem of channel boosting potential saturation can be alleviated, so that program disturb at high Vpgm is reduced.

In one approach, a number of memory devices are tested to develop a curve such as shown in FIG. 12d, and control circuitry of a memory device is configured to implement a switchover based on the curve. The curve may be defined by data points in a table. The control circuitry may be similarly configured to implement other curves as provided herein.

Figure 12E:
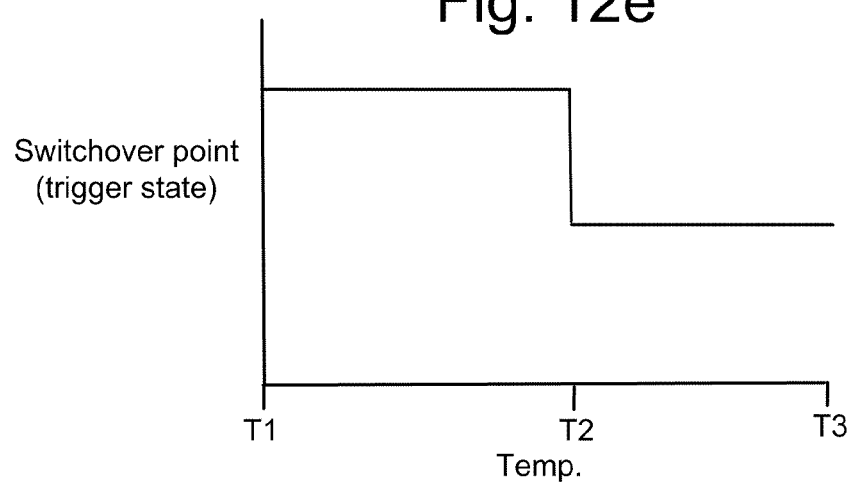
FIG. 12e depicts a switchover point in terms of a trigger state as a function of temperature.

FIG. 12e depicts a switchover point in terms of a trigger state as a function of temperature. Another approach for implementing a switchover to shorter duration programming pulses involves tracking storage elements which are being programmed to a particular data state. The switchover can be triggered when a predetermined portion of the storage elements are verified to reach the particular data state. The verify operations which normally occur after each programming pulses in a programming operation can be used so that no additional verify operations are needed. Generally, data is encoded into $2^N$ data states using an integer N>1 bits per storage element (e.g., four or more states and two or more bits per storage element), and encoding schemes are used in which an approximately equal number of storage elements are programmed into each state. For example, with four states: E, A, B and C, about one fourth of the storage elements on a selected word line will be programmed to the E state, another one fourth of the storage elements will be programmed to the A state, another one fourth of the storage elements will be programmed to the B state, and another one fourth of the storage elements will be programmed to the C state. Thus, different subsets of storage elements are programmed to different states, one subset per state.

Thus, a particular state, e.g., one of the available four or more states, can be selected as the trigger state. The switchover can be triggered when a predetermined portion of the storage elements which are intended to be programmed to the particular state are verified to reach the particular data state. For example, assume state A is the trigger state, and 1024 storage elements on a word line are being programmed, with 256 storage elements to remain in the E state, 256 storage elements to be programmed to the A state, 256 storage elements to be programmed to the B state, and 256 storage elements to be programmed to the C state. The switchover can be triggered when a predetermined portion of the 256 A-state storage elements of the selected word line are verified to reach the A state. The predetermined portion can be expressed in terms of a number N2 of storage elements, a fraction, a percentage or the like. For example, N2 can be 128 storage elements, representing one half of the A-state storage elements.

Moreover, the switchover state can be fixed, such as the lowest state, e.g., the A state when there are four possible states. Or, the switchover state can be dynamically and adaptively selected based on a criterion such as temperature. A lower switchover state is selected when the temperature is higher, e.g., between T2 and T3, than when the temperature is lower, e.g., between T1 and T2. A lower switchover state results in the switchover occurring relatively sooner in the programming process, compared to a higher switchover state. For example, the switchover state may be state A for temperatures between T1 and T2, and state B for temperatures between T2 and T3, when there are four data states. If there are eight data states, E, A, B, C, D, E, F and G, from lowest to highest, the trigger state may be, e.g., the D state for higher temperatures and the F state for lower temperatures. More than two switchover states may be used as well.

The trigger state can be tailored to each word line, or to groups of word lines, e.g., trigger state 1 for drain side word lines, and trigger state 2 for source and middle word lines. It is also possible for the temperature at which a different trigger state is indicated, e.g., T2, to be tailored to each word line, or to groups of word lines, e.g., T2=temp1 for drain side word lines, and T2=temp2 for source and middle word lines.

Figure 12F:
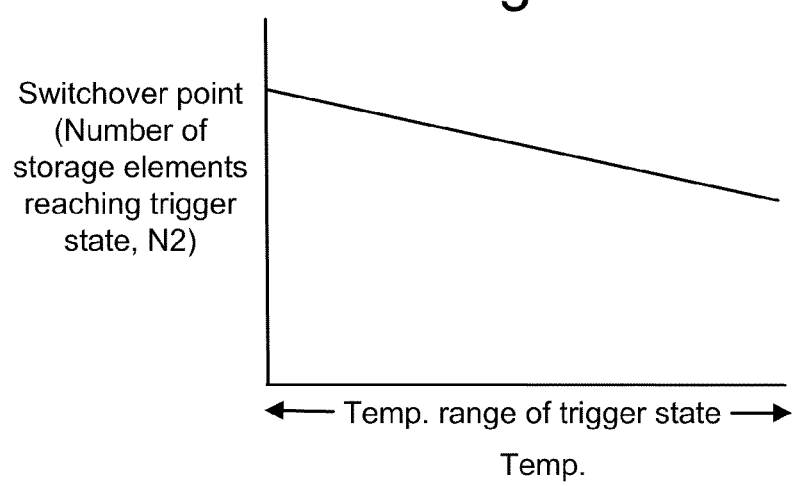
FIG. 12f depicts a switchover point in terms of a number of storage elements reaching a trigger state, as a function of temperature.

FIG. 12f depicts a switchover point in terms of a number of storage elements reaching a trigger state, as a function of temperature. In a further option, once a switchover or trigger state is determined, either as a predetermined state or as a dynamically selected state, based on temperature, the switchover point can be further refined as a function of temperature. In particular, it was mentioned that the switchover can be triggered when a predetermined portion or number N2 of the storage elements are verified to reach the particular data state. Here, N2 varies as a function of temperature, so that N2 is lower when temperature is higher and N2 is higher when temperature is lower. The horizontal scale depicts a temperature range of the trigger state.

For example, the temperature range in FIG. 12f may extend from T1 to T2, or from T2 to T3 (see FIG. 12e). For a given trigger state, the switchover to shorter duration programming pulses will occur relatively sooner when the temperature is relatively higher, within the range of temperatures for the trigger state. Similarly, the switchover to shorter duration programming pulses will occur relatively later when the temperature is relatively lower, within the range of temperatures for the trigger state. For instance, if state A is the trigger state, and the temperature is at a high end of the range for the state, N2 may represent a number which is 70% of the storage elements of a selected word line which are being programmed to state A, which may be the same as 70%×¼ of the storage elements on the selected word line, for instance, assuming four possible states. If the temperature is at a low end of the range for the state, N2 may represent a comparable value of 90%, for instance.

In percentage terms, to avoid unexpected results due to very slow or fast programming storage elements, N2 should avoid values close to 0% or 100%. Testing or simulations can be used to identify an optimal value for N2. For instance, storage elements on a word line, at a certain temperature, can be programmed with a certain value of N2 and read back. When reading, a number of bit errors can be determined. This process can be repeated with different values of N2 to find the value which yields the lowest number of errors. Moreover, N2 can be tailored to each word line, or to groups of word lines, e.g., N2=value1 for drain side word lines, and N2=value2 for source and middle word lines.

Figure 13:
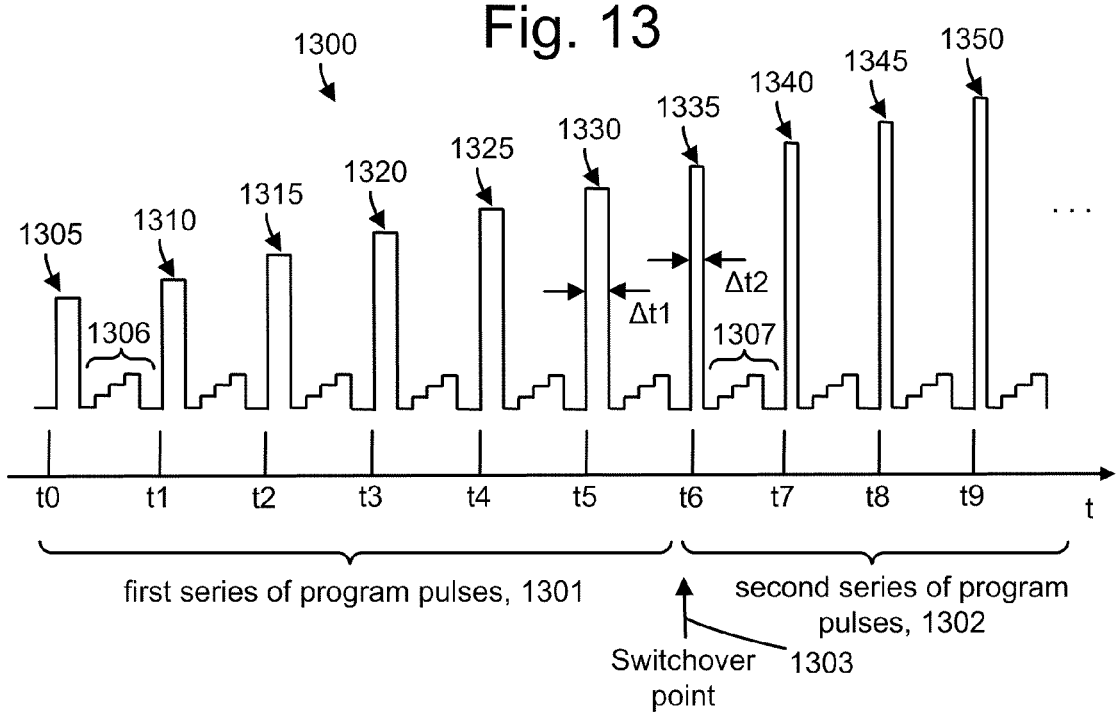
FIG. 13 depicts programming pulses in a programming operation, where there is a switchover to shorter duration programming pulses partway through the programming operation.

FIG. 13 depicts programming pulses in a programming operation, where there is a switchover to shorter duration programming pulses partway through the programming operation. As mentioned, a split programming pulse width approach which uses shorter duration programming pulses can achieve a higher boosting potential. When Vpgm reaches a certain level, we split the programming pulse into two or more shorter pulses while maintaining the Vpgm level and total program time in the program cycle. After each short programming pulse, we discharge the channel and then re-boost the channel to ensure that boosting potential is high during the next short programming pulse. After each short programming pulse, we can also perform a verify operation. This can slow down the programming operation, compared to applying a programming pulse which is not followed by a verify operation, but this approach can lock out bits which pass the verify after each short pulse, and reduce the possibility of having the worst case pattern for boosting, where an inhibited channel has programmed channels as both neighbors. It is also possible to apply two or more successive short programming pulses without a verify operation, while other short programming pulses are followed by a verify operation.

Generally, a programming operation can involve applying a pulse train to a selected word line, where the pulse train includes programming pulses followed by one or more verify pulses. Note that a programming pulse can have any number of different waveform shapes. A square waveform is depicted, although other shapes are possible such as a multilevel shape or a ramped shape. Further, a switch in programming pulse duration, from longer duration pulses to shorter duration pulses, can occur during the pulse train. The pulse train 1300 includes a series of programming pulses 1305, 1310, 1315, 1320, 1325, 1330, 1335, 1340, 1345, 1350, . . . , that are applied to a word line selected for programming, at times t0-t9, respectively. In one embodiment, the programming pulses have a voltage, $V_{PGM}$, which starts at 12 V and increases by increments, e.g., 0.5 V, for each successive programming pulse until a maximum of, e.g., 20-25 V is reached. In between the programming pulses are verify pulses, e.g., three verify pulses, which are used in a verify operation. In some embodiments, there can be a verify pulse for each state that data is being programmed into, e.g., state A, B and C. In other embodiments, there can be more or fewer verify pulses. The verify pulses in each set can have amplitudes of Vva, Vvb and Vvc (FIG. 9) or Vvb' (FIG. 10a), for instance. Example verify pulses 1306 follow the programming pulse 1305, and example verify pulses 1307 follow the programming pulse 1335.

A switchover point 1303 indicates a division between a first series of programming pulses 1301 in which longer duration programming pulses (with a duration Δt1) are used, such as programming pulses 1305, 1310, 1315, 1320, 1325 and 1330, and a second series of programming pulses 1302 in which shorter duration programming pulses (with a duration Δt2<Δt1) are used, such as programming pulses 1335, 1340, 1345 and 1350. The switchover point can be determined using various criteria as set forth herein, including temperature, selected word line position and/or tracking of storage element to a trigger state.

Figure 14:
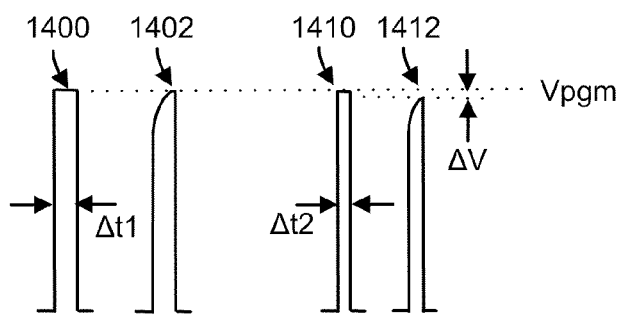
FIG. 14 depicts programming pulses seen by storage elements based on their distance from a decoder side of a word line.

FIG. 14 depicts programming pulses seen by storage elements based on their distance from a decoder side of a word line. A program voltage is applied to one end of a selected word line, at a decoder side of the word line. Due to a word line resistance-capacitance (RC) delay, the shape of the programming pulse differs for storage elements which are closer to the decoder side compared to storage elements which are further from the decoder side. A programming pulse 1400 represents a pre-switchover, longer duration programming pulse, having a duration of Δt1, as seen by a storage element which is close to the decoder side, while a programming pulse 1402 represents the pre-switchover programming pulse as seen by a storage element which is far from the decoder side. The pulse 1402 is attenuated at its leading edge, but the pulse reaches the desired amplitude of Vpgm. A programming pulse 1410 represents a post-switchover, shorter duration programming pulse, having a duration of Δt2, as seen by a storage element which is close to the decoder side, while a programming pulse 1412 represents the post-switchover programming pulse as seen by a storage element which is far from the decoder side. The pulse 1412 is attenuated at its leading edge and reaches a level of Vpgm-Δ, slightly below the desired amplitude of Vpgm.

Thus, the Vpgm seen by the storage elements which are closer to the decoder side can become slightly higher than the Vpgm seen by the storage elements which are further from the decoder side. However, this will not worsen program disturb since, for the storage elements close to the decoder side of the word line, the programming can finish earlier, so that these storage elements are locked out from further programming once the shorter duration pulses are applied, and their channels are inhibited from programming. For a given storage element, when channels of neighboring storage elements are inhibited, the channel boosting potential is significantly higher. Therefore, program disturb will not become worse for storage elements close to the decoder side when using the shorter duration programming pulses.

Note that the RC delay of a word line also imposes a lower practical limit as to how small the pulse width can be. If the pulse width is too small, it may not be able to reach a desired high program voltage level. Also, if the pulse width is too small, the storage element will not be programmed due to insufficient Fowler-Nordheim tunneling injection. A reduced duration pulse width of about one-third to one-half of the initial pulse width is expected to be realistic. However, this range can vary for different memory devices.

Figure 15:
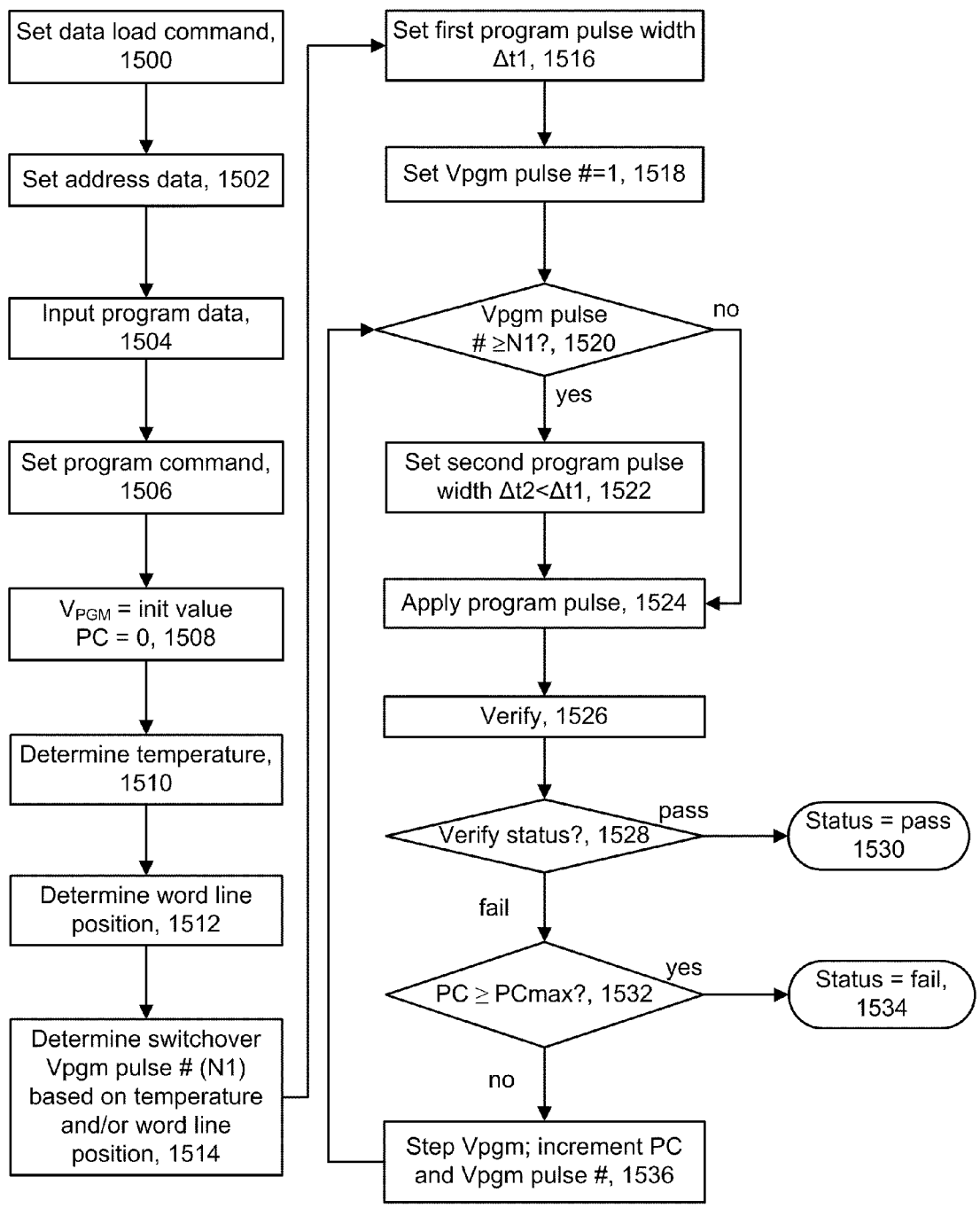
FIG. 15 is a flow chart describing one embodiment of a method for programming non-volatile memory, where a switchover to shorter duration programming pulses is based on a programming pulse number.

FIG. 15 is a flow chart describing one embodiment of a method for programming non-volatile memory, where a switchover to shorter duration programming pulses is based on a programming pulse number. In one implementation, storage elements are erased (in blocks or other units) prior to programming. In step 1500, a "data load" command is issued by the controller and input received by control circuitry 510. In step 1502, address data designating the page address is input to decoder 514 from the controller or host. In step 1504, a page of program data for the addressed page is input to a data buffer for programming. That data is latched in the appropriate set of latches. In step 1506, a "program" command is issued by the controller to state machine 512.

Triggered by the "program" command, the data latched in step 1504 will be programmed into the selected storage elements controlled by state machine 512 using the stepped programming pulses of the pulse train 1300 of FIG. 13 applied to the appropriate selected word line. In step 1508, the program voltage, $V_{PGM}$, is initialized to the starting pulse (e.g., 12 V or other value) and a program counter (PC) maintained by state machine 512 is initialized at zero. In step 1510, a temperature is determined by accessing the temperature sensing circuit 515. In step 1512, a word line position is determined, which is the word line number of the currently selected word line for programming. In step 1514, a switchover programming pulse number (N1) is determined based on the temperature and/or word line position, such as by accessing data as depicted in FIG. 12*d*. In step 1516, the programming pulse width is set, such as $\Delta t1$ in FIG. 13. Initially, at the start of the programming operation, a longer duration pulse is used. At step 1518, a current programming pulse number or count is initialized to a value of one. At decision step 1520, a determination is made as to whether the current programming pulse number equals or exceeds N1. If the current programming pulse number does not equal or exceed N1, a programming pulse with a duration of $\Delta t1$ is applied, at step 1524.

Thus, the first programming pulse is applied to the selected word line to begin programming storage elements associated with the selected word line. If logic "0" is stored in a particular data latch indicating that the corresponding storage element should be programmed, then the corresponding bit line is grounded. On the other hand, if logic "1" is stored in the particular latch indicating that the corresponding storage element should remain in its current data state, then the corresponding bit line is connected to 1.5-3 V to inhibit programming.

In step 1526, the states of the selected storage elements are verified in a verify operation. If it is detected that the target threshold voltage of a selected storage element has reached the appropriate level, then the data stored in the corresponding data latch is changed to a logic "1." If it is detected that the threshold voltage has not reached the appropriate level, the data stored in the corresponding data latch is not changed. In this manner, a bit line having a logic "1" stored in its corresponding data latch does not need to be programmed. When all of the data latches are storing logic "1," the state machine (via the wired-OR type mechanism described above) knows that all selected storage elements have been programmed. In step 1528, a check is made as to whether all of the data latches are storing logic "1." If all of the data latches are storing logic "1," the programming process is complete and successful because all selected storage elements were programmed and verified. A status of "PASS" is reported in step 1530. In some embodiments, the programming process is considered complete and successful even if not all selected storage elements were verified as being programmed. In such a case, errors during subsequent read operations can occur due to insufficient programmed storage elements. However, these errors can be corrected by ECC.

If, in step 1528, it is determined that not all of the data latches are storing logic "1," then the programming process continues. In some embodiments, the program process stops even if not all of the data latches are storing logic "1". In step 1532, the program counter PC is checked against a program limit value PCmax. One example of a program limit value is twenty; however, other numbers can also be used. If the program counter PC is not less than PCmax, then the program process has failed and a status of "FAIL" is reported in step 1534. If the program counter PC is less than PCmax, then step 1536 is performed, in which VPGM is increased by the step size, the program counter PC is incremented by one, and the current programming pulse number is incremented by one. The process then loops back to step 1520 to determine whether the current programming pulse number equals or exceeds N1. If the current programming pulse number does equal or exceed N1, a second programming pulse width $\Delta t2<\Delta t1$ is set. Thus, subsequent programming pulses will have a shorter duration. Programming then continues as discussed above. If the current programming pulse number does not equal or exceed N1, another programming pulse with the first pulse width $\Delta t1$ is applied, at step 1524.

Note that it is also possible to use more than two programming pulse durations. For example, in a pulse train, programming pulses with a first duration $\Delta t1$ can be followed by programming pulses with a second duration $\Delta t2<\Delta t1$, which in turn are followed by programming pulses with a third duration $\Delta t3<\Delta t2$.

Figure 16:
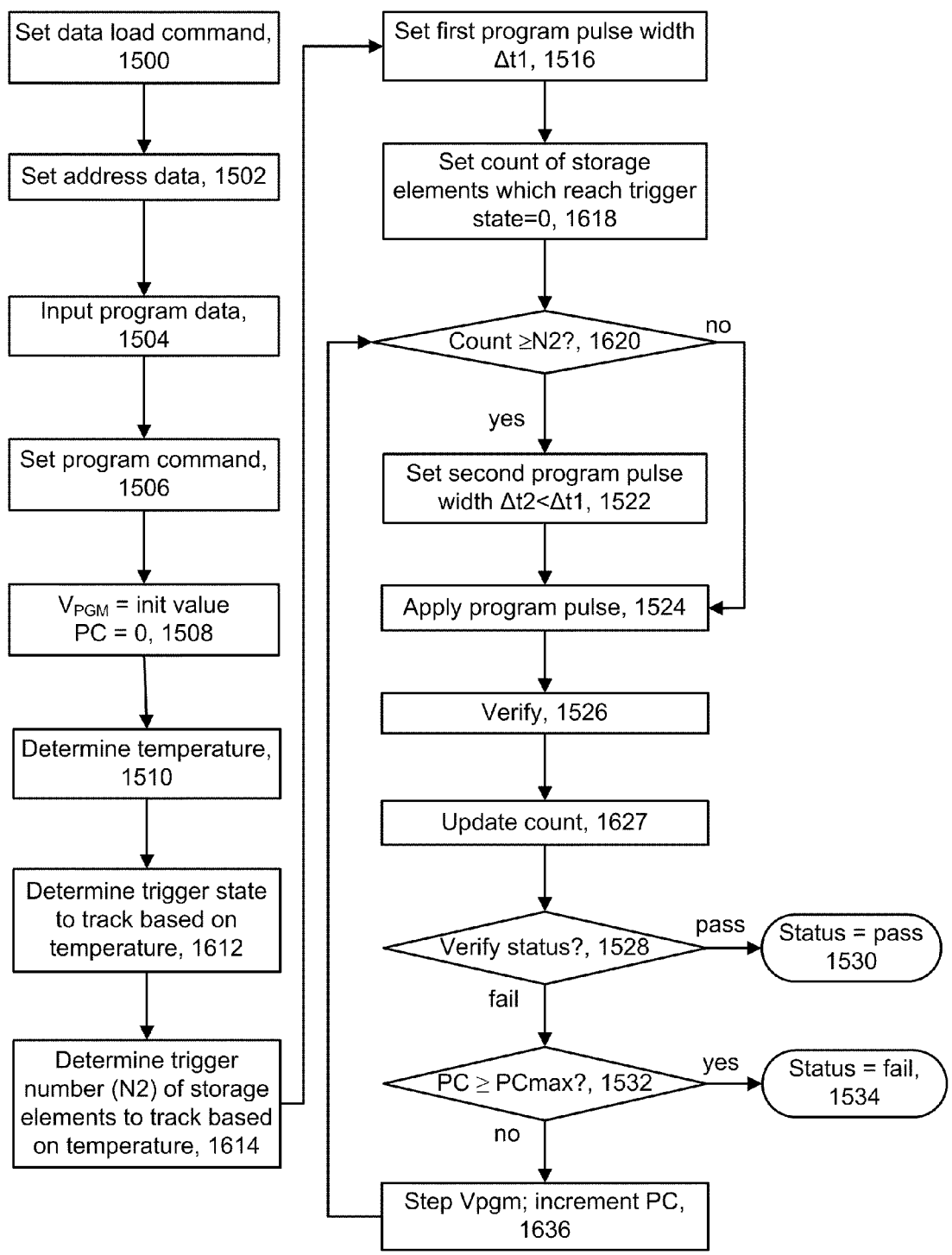
FIG. 16 is a flow chart describing another embodiment of a method for programming non-volatile memory, where a switchover to shorter duration programming pulses is based on a number of storage elements reaching a trigger state.

FIG. 16 is a flow chart describing another embodiment of a method for programming non-volatile memory, where a switchover to shorter duration programming pulses is based on a number of storage elements reaching a trigger state. Like numbered steps correspond to those in FIG. 15.

Step 1612 includes determining a trigger state to track based on temperature, such as by using the information in FIG. 12*e*. Step 1614 includes determining a trigger number of storage elements N2 to track in the tracked state, based on the temperature. In step 1516, the programming pulse width is determined, such as $\Delta t1$ in FIG. 13. At step 1618, a count of storage element which have reached the trigger state is initialized to a value of zero. At decision step 1620, a determination is made as to whether the count equals or exceeds N2. If the current count does not equal or exceed N2, a programming pulse with a duration of $\Delta t1$ is applied, at step 1524.

In step 1526, the states of the selected storage elements are verified, as discussed. In step 1627, the count is updated by one for each storage element which has been verified to have reached the trigger state. Steps 1528, 1530, 1532 and 1534 proceed as discussed. At decision step 1532, if the program counter PC is less than PCmax, then step 1536 is performed, in which VPGM is increased by the step size, and the program counter PC is incremented by one.

The process then loops back to step 1620 to determine whether the current count equals or exceeds N2. If the current count does equal or exceeds N2, a second programming pulse width $\Delta t2<\Delta t1$ is set. Thus, subsequent programming pulses will have a shorter duration of $\Delta t2$. Programming then continues as discussed above. In this case, a switchover to shorter duration programming pulses is triggered by tracking storage elements whose threshold voltage reaches a trigger state. Note that the trigger state is a data state which encodes bits in this example. It is also possible to trigger a switchover to shorter duration programming pulses by tracking storage elements whose threshold voltage reaches a specified verify level which is different than a verify level of a data state. This provides greater flexibility but results in additional verify operations. An approach which uses the existing verify levels which are associated with data states can be more efficient as it makes use of the existing verify operations without requiring additional verify operations.

Triggering a switchover to shorter duration programming pulses by tracking storage elements is an adaptive approach which accounts for various performance changes which can occur over time in a memory device. For example, as a memory device accumulates more program-erase cycles, the storage elements may program faster, e.g., with fewer programming pulses. Moreover, different memory devices, or different blocks of storage elements in a memory array, can program at different speeds. An adaptive switchover automatically accounts for such variations.

In one embodiment of the technology described herein, a method for operating non-volatile storage includes applying a first series of programming pulses in a programming operation to a selected word line in a set of word lines, where the set of word lines is in communication with a set of storage elements, and the selected word line is in communication with at least one selected storage element and at least one unselected storage element of the set of storage elements. The method further includes determining if a switching criterion is met, where the switching criterion depends on a temperature. If the switching criterion is met, the method further includes switching from the applying the first series of programming pulses to applying a second series of programming pulses in the programming operation to the selected word line, where at least one programming pulse in the second series has a shorter duration than at least one programming pulse in the first series.

In another embodiment, a non-volatile storage system includes a set of storage elements, a set of word lines in communication with the set of storage elements, and one or more control circuits in communication with the set of word lines. The one or more control circuits: (a) apply a first series of programming pulses in a programming operation to a selected word line in the set of word lines, where the selected word line is in communication with at least one selected storage element and at least one unselected storage element of the set of storage elements, (b) determine if a switching criterion is met, where the switching criterion depends on a temperature, and (c) if the switching criterion is met, switch from applying the first series of programming pulses to applying a second series of programming pulses in the programming operation to the selected word line, where at least one programming pulse in the second series has a shorter duration than at least one programming pulse in the first series.

In another embodiment, a method for operating non-volatile storage includes applying a first series of programming pulses in a programming operation to a selected word line in a set of word lines, where the set of word lines extends between a source side of the set of word lines and a drain side of the set of word lines, and is in communication with a set of storage elements, and the selected word line is in communication with at least one selected storage element and at least one unselected storage element of the set of storage elements. The method further includes determining if a switching criterion is met, where the switching criterion depends on a position of the selected word line in the set of word lines. If the switching criterion is met, the method further includes switching from the applying the first series of programming pulses to applying a second series of programming pulses in the programming operation to the selected word line, where at least one programming pulse in the second series has a shorter duration than at least one programming pulse in the first series.

In another embodiment, a non-volatile storage system includes a set of NAND strings including a selected NAND string and an unselected NAND string, where each NAND string has storage elements, and the set of NAND strings is in communication with a set of word lines which extends between a source side of the set of word lines and a drain side of the set of word lines. Further, one or more control circuits are in communication with the set of word lines. The one or more control circuits perform a programming operation in which different subsets of storage elements in the set of storage elements are programmed to different respective states of four or more states, and during the programming operation, the one or more control circuits: (a) apply a first series of programming pulses to a selected word line of the set of word lines, (b) determine if a switching criterion is met, where the switching criterion depends on a portion of the storage elements completing programming to one state of the four or more states, and the one state is selected based on a temperature, and (b) if the switching criterion is met, switch from applying the first series of programming pulses to apply a second series of programming pulses to the selected word line, where at least one programming pulse in the second series has a shorter duration than at least one programming pulse in the first series.

Corresponding methods, systems and computer-or processor-readable storage devices for performing the methods provided herein are provided.

The foregoing detailed description has been presented for purposes of illustration and description. It is not intended to be exhaustive or limited to the precise form disclosed. Many modifications and variations are possible in light of the above teaching. The described embodiments were chosen in order to best explain the principles of the technology and its practical application, to thereby enable others skilled in the art to best utilize the technology in various embodiments and with various modifications as are suited to the particular use contemplated. It is intended that the scope of the technology be defined by the claims appended hereto.

What is claimed is:

1. A method for operating non-volatile storage, comprising:
    applying a first series of programming pulses in a programming operation to a selected word line in a set of word lines, the set of word lines is in communication with a set of storage elements, and the selected word line is in communication with at least one selected storage element and at least one unselected storage element of the set of storage elements;
    determining if a switching criterion is met, the switching criterion depends on a temperature; and
    if the switching criterion is met, switching from the applying the first series of programming pulses to applying a second series of programming pulses in the programming operation to the selected word line, at least one programming pulse in the second series has a shorter duration than at least one programming pulse in the first series, the switching occurs partway through the programming operation.

2. The method of claim 1, wherein:
    the switching criterion varies with the temperature so that the second series of programming pulses is applied relatively sooner in the programming operation when the temperature is relatively higher, and the second series of programming pulses is applied relatively later in the programming operation when the temperature is relatively lower.

3. The method of claim 1, wherein:
    the switching criterion is not met if the temperature is sufficiently low, in which case there is no switching from the applying the first series of programming pulses to the applying the second series of programming pulses, the first series of programming pulses is applied until the programming operation is completed, and each programming pulse in the first series has a same duration.

4. The method of claim 1, wherein:
    each programming pulse in the first series has a first duration, and each programming pulse in the second series has a second duration, which is shorter than the first duration.

5. The method of claim 4, wherein:
    the second duration is one-third to one-half the first duration.

6. The method of claim 1, wherein:
    the determining if the switching criterion is met comprises determining if a subset of storage elements in the set of storage elements has completed programming to one state of four or more states, the one state is based on the temperature.

7. The method of claim 6, wherein:
the one state is a relatively lower state when the temperature is relatively higher, and the one state is a relatively higher state when the temperature is relatively lower.

8. The method of claim 6, wherein:
the determining if the switching criterion is met comprises determining if a particular number of storage elements in the set of storage elements have completed programming to a particular state of four or more states, the particular number is based on the temperature.

9. The method of claim 1, wherein:
the switching criterion comprise a programming pulse number which depends on the temperature.

10. The method of claim 1, wherein:
the switching criterion varies with a position of the selected word line in the set of word lines.

11. A non-volatile storage system which performs the method of claim 1.

12. A non-volatile storage system, comprising:
a set of NAND strings including a selected NAND string and an unselected NAND string, each NAND string comprising a plurality of storage elements, the set of NAND strings is in communication with a set of word lines which extends between a source side of the set of word lines and a drain side of the set of word lines; and
one or more control circuits in communication with the set of word lines, the one or more control circuits perform a programming operation in which different subsets of storage elements in the set of storage elements are programmed to different respective states of four or more states, and during the programming operation, the one or more control circuits: (a) apply a first series of programming pulses to a selected word line of the set of word lines, (b) determine if a switching criterion is met, the switching criterion depends on a portion of the storage elements completing programming to one state of the four or more states, the one state is selected based on a temperature, and (b) if the switching criterion is met, switch from applying the first series of programming pulses to apply a second series of programming pulses to the selected word line, at least one programming pulse in the second series has a shorter duration than at least one programming pulse in the first series.

13. The non-volatile storage system of claim 12, wherein:
the one state is a relatively lower state when the temperature is relatively higher, and the one state is a relatively higher state when the temperature is relatively lower.

14. The non-volatile storage system of claim 12, wherein:
each programming pulse in the first series has a first duration, and each programming pulse in the second series has a second duration, which is shorter than the first duration.

15. The non-volatile storage system of claim 12, wherein:
the second duration is one-third to one-half the first duration.

16. The non-volatile storage system of claim 12, wherein:
the one state is one particular programmed state of the four or more states when the temperature is above a threshold, and the one state is another, higher particular programmed state of the four or more states when the temperature is below the threshold.

17. The non-volatile storage system of claim 12, wherein:
the one state is a first lowest programmed state of the four or more states when the temperature is above a threshold, and the one state is a second lowest programmed state of the four or more states when the temperature is below the threshold.

18. The non-volatile storage system of claim 12, wherein:
the switching criterion comprise a programming pulse number which depends on the temperature.

19. The non-volatile storage system of claim 12, wherein:
the switching criterion varies with a position of the selected word line in the set of word lines.

* * * * *